United States Patent
Hase

(10) Patent No.: US 7,968,947 B2
(45) Date of Patent: Jun. 28, 2011

(54) SEMICONDUCTOR DEVICE AND MANUFACTURING PROCESS THEREFOR

(75) Inventor: Takashi Hase, Tokyo (JP)

(73) Assignee: NEC Corporation, Tokyo (JP)

( * ) Notice: Subject to any disclaimer, the term of this patent is extended or adjusted under 35 U.S.C. 154(b) by 225 days.

(21) Appl. No.: 12/086,435

(22) PCT Filed: Dec. 26, 2006

(86) PCT No.: PCT/JP2006/325868
§ 371 (c)(1),
(2), (4) Date: Jun. 12, 2008

(87) PCT Pub. No.: WO2007/077814
PCT Pub. Date: Jul. 12, 2007

(65) Prior Publication Data
US 2009/0152640 A1    Jun. 18, 2009

(30) Foreign Application Priority Data
Jan. 6, 2006  (JP) .................... 2006-001359

(51) Int. Cl.
*H01L 27/092* (2006.01)
*H01L 21/70* (2006.01)

(52) U.S. Cl. ............ 257/371; 257/369; 257/761
(58) Field of Classification Search .......... 257/369, 257/371, 761
See application file for complete search history.

(56) References Cited

U.S. PATENT DOCUMENTS
6,599,831 B1   7/2003 Maszara et al.
2003/0203609 A1   10/2003 Maszara et al.
2007/0004163 A1*   1/2007 Fukada et al. ............ 438/373
2009/0096032 A1*   4/2009 Saitoh et al. ............ 257/369

FOREIGN PATENT DOCUMENTS
| JP | 2000-77538 | 3/2000 |
| JP | 2005-129551 | 5/2005 |
| JP | 2005-228761 | 8/2005 |
| JP | 2005-524243 | 8/2005 |

(Continued)

OTHER PUBLICATIONS

Kensuke Takahashi, et al., Electron Devices Meeting, 2004. IEDM Technical Digest. IEEE International: Dec. 13, 2004, p. 91-94.

(Continued)

*Primary Examiner* — Long K Tran
(74) *Attorney, Agent, or Firm* — McGinn IP Law Group, PLLC

(57) ABSTRACT

This invention provides a semiconductor device that can prevent a deviation of work function by adopting a gate electrode having a uniform composition and exhibits excellent operating characteristics by virtue of effective control of a $V_{th}$. The semiconductor device is characterized by comprising a PMOS transistor, an NMOS transistor, a gate insulating film comprising an Hf-containing insulating film with high permittivity, a line electrode comprising a silicide region (A) and a silicide region (B), one of the silicide regions (A) and (B) comprising a silicide (a) of a metal M, which serves as a diffusing species in a silicidation reaction, the other silicide region comprising a silicide layer (C) in contact with a gate insulating film, the silicide layer (C) comprising a silicide (b) of a metal M, which has a smaller atom composition ratio of the metal M than the silicide (a), and a dopant which can substantially prevent diffusion of the metal M in the silicide (b).

9 Claims, 10 Drawing Sheets

FOREIGN PATENT DOCUMENTS

| JP | 2005-252192 | 9/2005 |
|---|---|---|
| JP | 2005-294360 | 10/2005 |
| JP | 2006-5056 | 1/2006 |
| WO | WO 2007/026677 A1 | 3/2007 |
| WO | WO 2007/060938 A1 | 5/2007 |

OTHER PUBLICATIONS

D. Aime, et al., Electron Devices Meeting, 2004. IEDM Technical Digest. IEEE International: Dec. 13, 2004, p. 87-90.
PCT/IB/338.
PCT/IB/373.
English Language Translation of PCT/ISA/237.
Veloso A., et al., "Work function engineering by FUSI and its impact on the performance and reliability of oxynitride and Hf-silicate based MOSFETs", IMEC, Kapeldreef '75, 3001 Leuven, Belgique,IEEE International Electron Devices Meeting 2004: ( IEDM technical digest) ( 50th annual meeting ) ( San Francisco, CA, Dec. 13-15, 2004 ) International Electron Devices Meeting, San Francisco CA , ETATS-UNIS (2004) 2004 , pp. 855-858[Note(s) : pagination multiple, ] [Document : 4 p.] (7 ref.), [Notes: "IEEE Catalog No. 04CH37602"—T.p. verso] ISBN 0-7803-8684-1.

\* cited by examiner

FIG.1
(a)
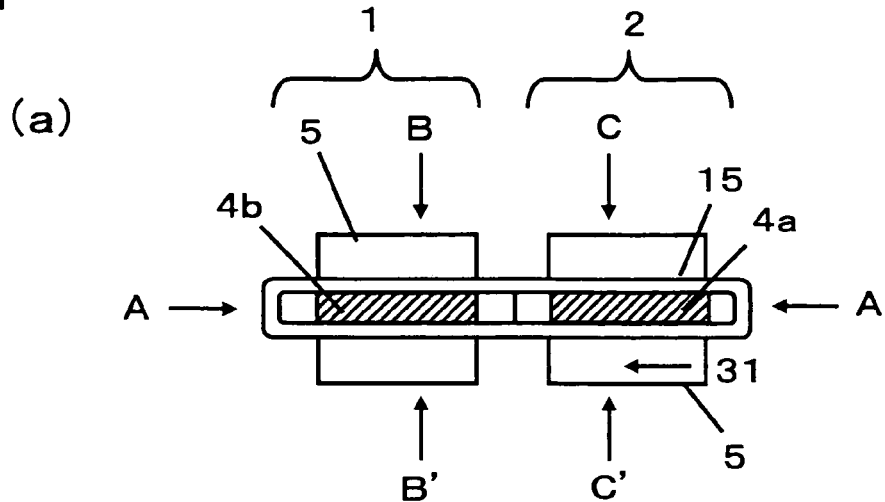
(b)
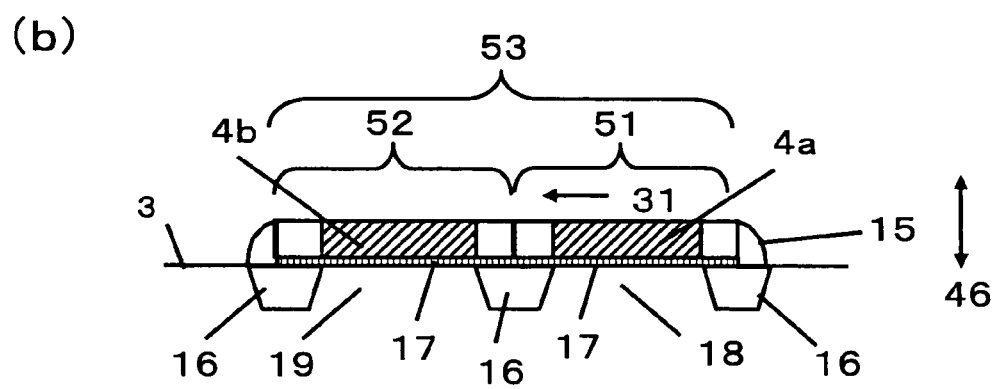
(c)
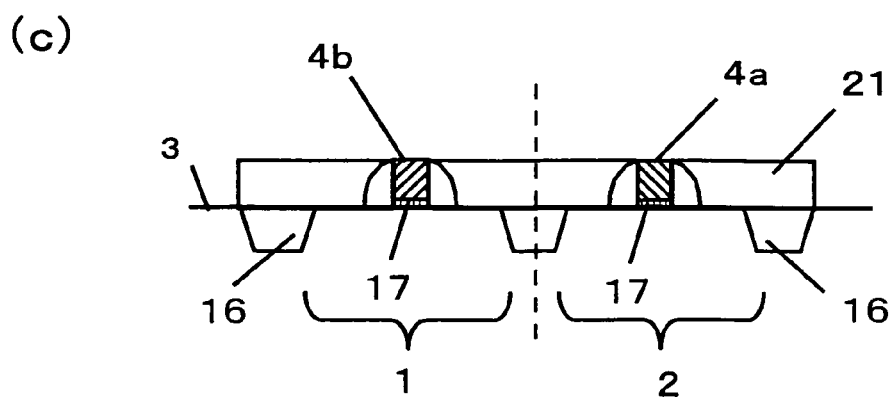

SEMICONDUCTOR DEVICE AND MANUFACTURING PROCESS THEREFOR

TECHNICAL FIELD

The present invention relates to a semiconductor device comprising an N-type and a P-type field effect transistors and a manufacturing process therefor.

BACKGROUND OF THE INVENTION

Recently, a field effect transistor comprising a metal gate electrode made of an alloy material such as a silicided metal has gathered attention. This field effect transistor comprising a metal gate electrode has an advantage that it reduces a compound capacity by eliminating depletion in a gate electrode and facilitates control of a $V_{th}$ (threshold voltage) by controlling a work function.

Conventionally, there has been used a semiconductor device comprising an N-type field effect transistor (hereinafter, referred to as an "NMOS transistor") and a P-type field effect transistor (hereinafter, referred to as a "PMOS transistor") in which gate electrodes of these MOS transistors are combined to be a single line electrode. In this semiconductor device, the sections of the line electrode over the N-type and P-type areas formed within the semiconductor substrate correspond to the gate electrodes in each MOS transistor, respectively.

In the above semiconductor device, each of an NMOS transistor and a PMOS transistor may have a different work function of a constituent material for a gate electrode giving an optimal $V_{th}$. Thus, in this type of semiconductor device, it is necessary that a section corresponding to a gate electrode in each MOS transistor in one line electrode is made of a separate material and a work function of a constituent material for each gate electrode is controlled to individually optimize a $V_{th}$ of each MOS transistor. Thus, there have been investigated technique for separately controlling work functions of gate electrode constituent materials in an NMOS transistor and a PMOS transistor.

A process for controlling a work function of a constituent material for a gate electrode is, for example, (1) forming a gate electrode in an NMOS transistor (hereinafter, referred to as a "gate electrode for an NMOS") and a gate electrode in a PMOS transistor (hereinafter, referred to as a "gate electrode for a PMOS") from materials containing mutually different elements, (2) forming a gate electrode for an NMOS and a gate electrode for a PMOS from materials containing the same elements with a different composition (atomic composition ratio) or (3) implanting a dopant element to both of gate electrode for an NMOS and gate electrode for a PMOS.

For example, as a method corresponding to the above (2) and (3), Japanese Laid-open Patent Publication No. 2005-129551 has disclosed a PMOS transistor comprising an Ni fully silicided electrode containing a P-type dopant with an Ni/(Ni+Si) composition ratio of 40 to 70 atomic % and an NMOS transistor comprising an Ni fully silicided electrode containing an N-type dopant with an Ni/(Ni+Si) composition ratio of 30 to 60 atomic %. In this semiconductor device, doses of a P-type and an N-type dopants to these gate electrodes and a composition ratio of Ni silicide on a silicon oxide gate insulating film are adjusted to be within optimum ranges. The reference has described that it can extend a modulation width of a work function and a $V_{th}$ for a gate electrode for each MOS can be controlled to a desired value.

SUMMARY OF THE INVENTION

The above related art, however, has problems as follows. First, in the process (1), modulation widths of work functions in a gate electrode for an NMOS and a gate electrode for a PMOS can be increased, but the gate electrode for an NMOS and the gate electrode for a PMOS are made of mutually different materials while being combined to form one line electrode. Thus, during forming gate electrodes, mutual diffusion occurs between the constituent materials for these gate electrodes for an MOS, so that each gate electrode for an MOS fails to have a homogeneous composition, leading to deviation of a work function of each gate electrode for an MOS from a desired value.

In the process (2), modulation widths of work functions in a gate electrode for an NMOS and a gate electrode for a PMOS are reduced. In addition, though not to the extent of the process (1), during forming gate electrodes, mutual diffusion occurs between the constituent materials for these gate electrodes for an MOS, leading to deviation of a work function of each gate electrode for an MOS from a desired value.

Furthermore, in the process (3), a gate electrode for an NMOS and a gate electrode for a PMOS has the same silicide composition, so that on a high-dielectric gate insulating film containing Hf, a work function of a constituent material in a gate electrode cannot be modulated.

Thus, the inventor have intensely conducted investigations and have finally found that diffusion of a metal element from a gate electrode with a higher atomic composition ratio of the metal into a gate electrode with a lower atomic composition ratio of the metal can be prevented by (a) forming a Hf-containing high-dielectric insulating film as a gate insulating film, (b) using a gate electrode for an NMOS and a gate electrode for a PMOS which are made of a silicide from the same elements with a different composition to extend modulation widths of work functions in gate electrodes for facilitating control of work functions ($V_{th}$) and (c) forming a silicide layer (C) containing a dopant element in the gate insulating film side of a gate electrode having a lower atomic composition ratio of the metal of the gate electrode for an NMOS and the gate electrode for a PMOS.

The present invention is completed in view of the above problems and an objective of the present invention is to provide a semiconductor device comprising a line electrode as a combination of a gate electrode for an NMOS and a gate electrode for a PMOS, wherein the above constitutions (a) to (c) allow for controlling work functions of the gate electrode constituent materials to achieve a desired $V_{th}$. Another objective of the present invention is to provide a process for more simply manufacturing the above semiconductor device in a reproducible fashion.

To solve the above problems, the present invention is characterized in the following constitutions.

[1] A semiconductor device, comprising:

an N-type region and a P-type region formed within a semiconductor substrate such that the N-type region and the P-type region are isolated by an isolation region;

a line electrode extending from a region over the N-type region through a region over the isolation region to a region over the P-type region;

a PMOS transistor comprising a first gate electrode constituted by the line electrode over the N-type region and a gate insulating film formed between the first gate electrode and the semiconductor substrate; and an NMOS transistor comprising a second gate electrode constituted by the line electrode over the P-type region and a gate insulating film formed between the second gate electrode and the semiconductor substrate, wherein the gate insulating film comprises at least a Hf-containing high-dielectric insulating film which contacts with the first gate electrode and the second gate electrode, the line electrode comprises a silicide region (A) comprising the first gate electrode and a silicide region (B) comprising the second gate electrode, one silicide region of the silicide region (A) and the silicide region (B) contains a silicide of a metal M (a) to be a diffusing species in a siliciding reaction, the other silicide region comprises a silicide layer (C) in contact with the gate insulating film, and the silicide layer (C) comprises a silicide of a metal M (b) having a smaller atomic composition ratio of metal M than the silicide (a) and a dopant substantially preventing diffusion of the metal M in the silicide (b).

[2] The semiconductor device as described in [1],
wherein the metal M is Ni,
the silicide region (A) is the one silicide region comprising an Ni silicide having an Ni atomic composition ratio of 60% or more as the silicide (a), and
the silicide region (B) is the other silicide region comprising an Ni silicide having an Ni atomic composition ratio of less than 60% as the silicide (b) in the silicide layer (C).

[3] The semiconductor device as described in [2],
wherein an Ni silicide as the silicide (a) is an $Ni_3Si$ crystal phase or $Ni_2Si$ crystal phase.

[4] The semiconductor device as described in [2] or [3],
wherein an Ni silicide as the silicide (b) is an NiSi crystal phase or $NiSi_2$ crystal phase.

[5] The semiconductor device as described in any of [2] to [4],
wherein the silicide layer (C) comprises, as the dopant, at least one element (D) selected from the group consisting of B, As, C, F and N, and
the total concentration of the element (D) in the silicide layer (C) is $1 \times 10^{20}$ cm$^{-3}$ or more.

[6] The semiconductor device as described in any of [2] to [4],
wherein the silicide layer (C) comprises, as the dopant, at least one element (D) selected from the group consisting of B, As, C, F and N, and
the total concentration of the element (D) in the silicide layer (C) is $3 \times 10^{20}$ cm$^{-3}$ or more.

[7] The semiconductor device as described in any of [1] to [6],
wherein the gate insulating film is multilayered, and
further comprising at least one of a silicon oxide layer and a silicon oxynitride layer below the Hf-containing high-dielectric insulating film.

[8] The semiconductor device as described in any of [1] to [7],
wherein the Hf-containing high-dielectric insulating film is a HfSiON layer.

[9] The semiconductor device as described in any of [1] to [8],
wherein the NMOS transistor and the PMOS transistor constitutes a CMOS transistor.

[10] A process for manufacturing the semiconductor device as described in [1], comprising:
preparing the semiconductor substrate comprising the N-type region and the P-type region isolated by the isolation region;
forming the gate insulating film comprising the Hf-containing high-dielectric insulating film at least in the uppermost surface over the semiconductor substrate;
forming a silicon layer over the gate insulating film;
implanting a dopant into only any one of the silicon layers over the P-type region and the N-type region, as dopant implanting step;

processing the silicon layers to form a gate pattern made of a silicon region extending from a region over the N-type region through a region over the isolation region to a region over the P-type region;
forming a gate sidewall on a sidewall of the gate pattern;
implanting a dopant into the semiconductor substrate using the gate pattern and the gate sidewall as a mask;
activating the dopant in the silicon region and the semiconductor substrate by heating;
forming an interlayer insulating film over the gate pattern;
removing the interlayer insulating film to expose the gate pattern;
depositing a silicide-formable metal M layer over the exposed gate pattern;
reacting the metal M with silicon constituting the gate pattern by heating to form a line electrode where, in the gate pattern constituted by the silicon regions over the N-type region and the P-type region, the other silicide region is the region implanted with the dopant in the dopant implanting step while the one silicide region is the region without being implanted the dopant; and
removing the metal M layer unreacted with the silicon in forming the line electrode.

[11] A process for manufacturing the semiconductor device as described in [1], comprising:
preparing the semiconductor substrate comprising the N-type region and the P-type region isolated by the isolation region;
forming the gate insulating film comprising the Hf-containing high-dielectric insulating film at least in the uppermost surface over the semiconductor substrate;
forming a silicon layer over the gate insulating film;
implanting a dopant into only any one of the silicon layers over the P-type region and the N-type region, as dopant implanting step;
forming a dopant-implantation preventing layer over the silicon layers;
processing the silicon layers and the dopant-implantation preventing layer to form a gate pattern made of a silicon region extending from a region over the N-type region through a region over the isolation region to a region over the P-type region and a dopant-implantation preventing mask over the gate pattern;
forming a gate sidewall on a sidewall of the gate pattern;
implanting a dopant into the semiconductor substrate using the gate pattern and the dopant-implantation preventing mask as a mask;
activating the dopant in the silicon region and the semiconductor substrate by heating;
forming an interlayer insulating film over the dopant-implantation preventing mask;
removing the interlayer insulating film and the dopant-implantation preventing mask to expose the gate pattern;
depositing a silicide-formable metal M layer over the exposed gate pattern;
reacting the metal M with silicon constituting the gate pattern by heating to form a line electrode where, in the gate pattern constituted by the silicon regions over the N-type region and the P-type region, the other silicide region is the region implanted with the dopant in the dopant implanting step while the one silicide region is the region without being implanted the dopant; and
removing the metal M layer unreacted with the silicon in forming the line electrode.

[12] The process for manufacturing a semiconductor device as described in [10] or [11], wherein
the metal M is Ni, in depositing the metal M layer, a ratio of a film thickness $T_M$ of the deposited metal M layer to a film thickness $T_{Si}$ of the silicon region, $T_M/T_{Si}$, is 1.65 or more, and in forming the line electrode, the heating is conducted at a temperature of 330° C. or more and 450° C. or less and the silicide (a) contained in the one silicide region is an $Ni_3Si$ crystal phase.

[13] The process for manufacturing a semiconductor device as described in [10] or [11], wherein the metal M is Ni, in depositing the metal M layer, a ratio of a film thickness $T_M$ of the deposited metal M layer to a film thickness $T_{Si}$ of the silicon region, $T_M/T_{Si}$, is 1.1 or more, and in forming the line electrode, the heating is conducted at a temperature of 240° C. or more and less than 320° C. and the silicide (a) contained in the one silicide region is in an $Ni_2Si$ crystal phase.

[14] The process for manufacturing a semiconductor device as described in any of [10] to [13], wherein the metal M is Ni, in forming the line electrode, the silicide (b) contained in the other silicide region is an $NiSi_2$ crystal phase or NiSi crystal phase.

The term "substantially preventing diffusion of a metal M" as used herein means that when a region of a metal-M silicide having a smaller metal-M atomic composition ratio is in contact with a region of a metal-M silicide having a larger metal-M atomic composition ratio, the metal M as a diffusing species does not diffuse from the region of a metal-M silicide having a larger metal-M atomic composition ratio to the region of a metal-M silicide having a smaller metal-M atomic composition ratio (the metal M does not diffuse in the metal-M silicide (b) having a smaller metal-M atomic composition ratio) by heating under any possible process temperature and temporal conditions in a manufacturing process for a semiconductor device of the present invention. Whether or not the metal M diffuses in this region of a metal-M silicide having a smaller metal-M atomic composition ratio can be checked by determining a concentration distribution of the metal M in the region of the metal-M silicide having a smaller metal-M atomic composition ratio after the above heating by means of EDX (Energy Dispersive X-ray Micro Analysis). Specifically, it can be checked by determining the presence or the absence of a region of a silicide having a larger metal-M atomic composition ratio (for example, a silicide (a)) in the other silicide region after the heating, in an extension direction of the line electrode from the interface side with the one silicide region by EDX analysis.

As shown in the embodiments described later, it can be checked by determining accordance of an expected effective work function assuming that the silicide layer (C) has a homogeneous composition with an actually observed effective work function.

The term, "metal M as a diffusing species" as used herein means that in the case that a silicon layer is in contact with a metal M layer, the metal M has a larger diffusion coefficient than silicon when heating is conducted (that is, when silicon and the metal M are mutually diffused; when siliciding is conducted). In the present invention, the silicides (a) and (b) contains metal-M silicides having a mutually different metal-M atomic composition ratio. Furthermore, the metal M has a larger diffusion efficient than silicon in the siliciding reaction and thus acts as a diffusing species. Therefore, between the one silicide region and the other silicide region, it may be enough to consider only diffusion of the metal M. Furthermore, since the other silicide region has a smaller metal-M atomic composition ratio than the one silicide region, it is enough to consider only diffusion of the metal M from the one silicide region to the other silicide region. In the present invention, since the other silicide region contains a dopant substantially preventing diffusion of the metal M in the silicide layer (C), a desired $V_{th}$ can be achieved in good reproducibility by forming each gate electrode for a MOS in a uniform composition and interaction between silicon constituting gate electrodes and gate insulating films.

Herein, a dopant concentration in a silicide layer (C) such as "$1 \times 10^{20}$ cm$^{-3}$ or more" and "$3 \times 10^{20}$ cm$^{-3}$ or more" means that such a concentration is maintained in the whole region in a thickness direction of the silicide layer (C) in the measurement by SIMS described later. When a plurality of dopants are used, the above expression means that the total concentration of all the dopants is "$1 \times 10^{20}$ cm$^{-3}$ or more" or "$3 \times 10^{20}$ cm$^{-3}$ or more".

A semiconductor device of the present invention comprises a gate insulating film comprising a Hf-containing high-dielectric insulating film, where a gate electrode for an NMOS and a gate electrode for a PMOS are combined to form a line electrode. Thus, there can be provided a semiconductor device capable of giving a desired $V_{th}$ in good reproducibility by forming each gate electrode for a MOS in a uniform composition and interaction between silicon constituting gate electrodes and gate insulating film materials (Hf-containing high-dielectric insulating films). $T_M$ and $T_{Si}$ are the thicknesses of the parts shown in, for example, FIGS. 4(b), 7(d) and 9(d), respectively.

BRIEF DESCRIPTION OF THE DRAWINGS

FIG. 1 illustrates an example of a semiconductor device of the present invention.

Figure 2:
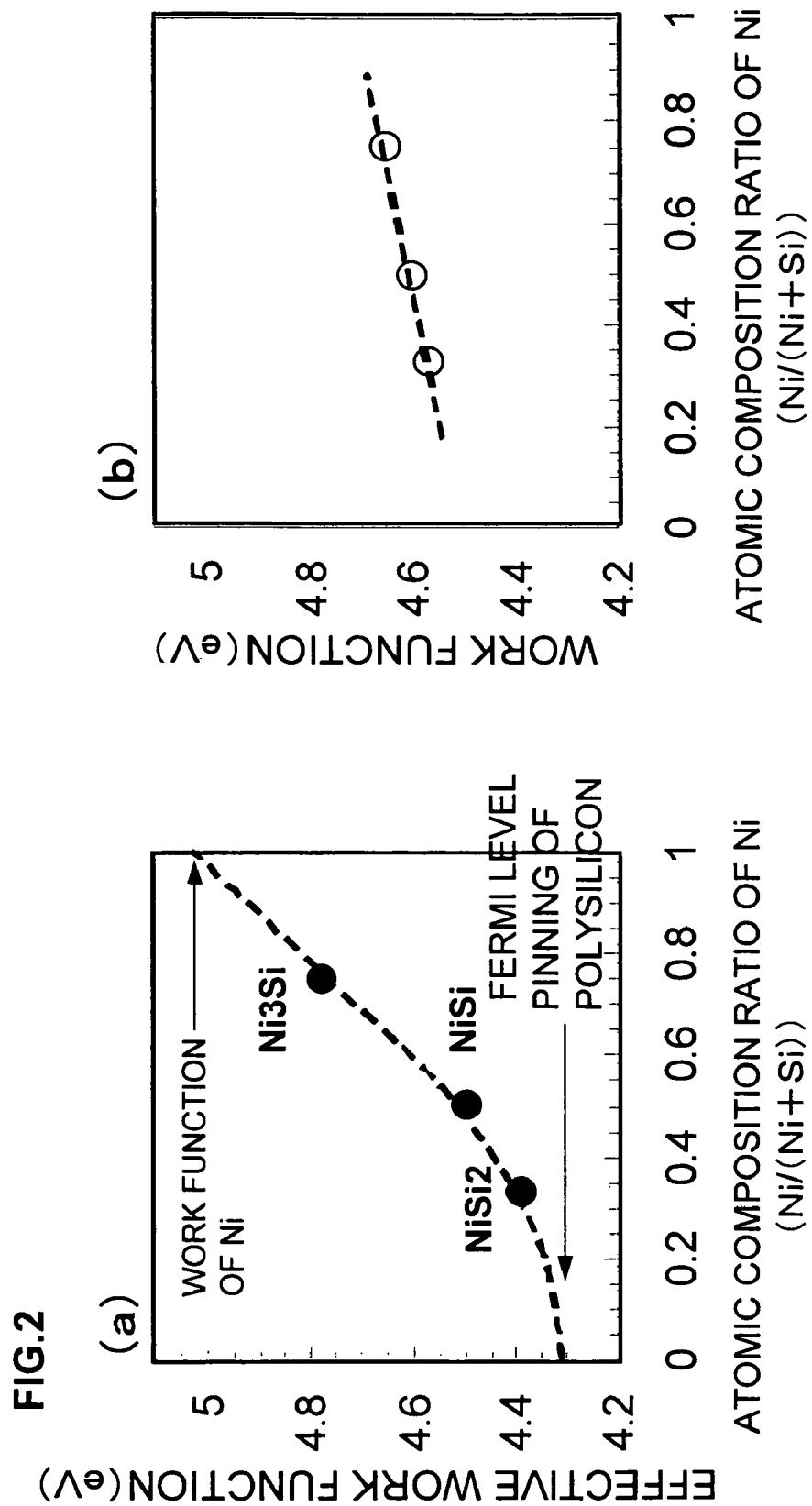
FIG. 2(a) shows relationship between an Ni composition on a HfSiON gate insulating film and an effective work function.
FIG. 2(b) shows relationship between an Ni composition on a $SiO_2$ gate insulating film and a work function.

The symbols have the following meanings; 1: NMOS transistor, 2: PMOS transistor, 3: semiconductor substrate, 4a: first gate electrode, 4b: second gate electrode, 5: source/drain region, 6a: silicide region having a larger metal atomic composition ratio, 6b: silicide region having a smaller metal atomic composition ratio, 6c: transition region, 7: interface between silicide regions having different compositions, 8: Ni-diffusion direction, 10: line electrode, 12: gate pattern part without dopant implantation, 13: gate pattern part being implanted with a dopant, 14a: gate pattern part implanted with only a dopant during forming a source/a drain region, 14b: gate pattern part implanted with dopants before gate processing and during forming a source/a drain region, 15: gate sidewall, 16: isolation region, 17: gate insulating film,

18: N-type region, 19: P-type region, 20: hard mask, 21: interlayer insulating film, 22: silicide, 24: Ni layer, 25: silicide gate electrode having a larger metal atomic composition ratio, 26: silicide gate electrode having a smaller metal atomic composition ratio, 27: Ni silicide comprising an $Ni_3Si$ crystal phase, 28: Ni silicide comprising an $NiSi_2$ phase, 29: Ni silicide comprising an NiSi crystal phase, 31: extension direction of a line electrode, 46: normal line direction of a semiconductor substrate, 51: silicide region (A), 52: silicide electrode (B), 53: line electrode, 55: silicide region (C), and 56: high-concentration dopant layer.

DETAILED DESCRIPTION OF THE INVENTION

1. Semiconductor Device

FIG. 1 shows an example of a semiconductor device according to the present invention. FIG. 1(a) is a plan view of the semiconductor device, FIG. 1(b) is an A-A' cross-sectional view of the semiconductor device in FIG. 1(a), and FIG. 1(c) shows a B-B' cross-sectional view of an NMOS transistor and a C-C' cross-sectional view of a PMOS transistor which constitute the semiconductor device of FIG. 1(a). FIG. 1(c) is a combination of the cross-sectional views of the NMOS transistor and the PMOS transistor taken on different lines, but not a cross-sectional view of the semiconductor device of the present invention taken on the same line (the broken line in FIG. 1(c) indicates that each MOS transistor is seen from a different cross-section. Hereinafter, similarly, the broken lines in FIGS. 4, 7 to 9 also indicate each MOS transistor is seen from a cross-section.

As shown in FIG. 1, the semiconductor device of the present invention is a semiconductor device comprising an NMOS transistor 1 and a PMOS transistor 2. In this semiconductor device, there are formed an N-type region (N-type semiconductor region; N well) 18 and a P-type region (P-type semiconductor region; P well) 19 which are isolated by an isolation region 16 within a semiconductor substrate 3. A first gate insulating film and a second gate insulating film 17 are formed over the N-type region 18 and P-type region 19, respectively. Each of the first gate insulating film and the second gate insulating film 17 comprises at least a Hf-containing high-dielectric insulating film in contact with the gate electrode. This gate insulating film may be multi-layered or single-layered. The first gate insulating film and the second gate insulating film may be made of mutually different materials or the same material.

From a region over an N-type region 18 through a region over an isolation region 16 to a region over a P-type region 19, a single line electrode 53 is formed, extending in the direction of an arrow 31. In the line electrode 53, the section over the N-type region 18 (the broken-line region in FIG. 1) corresponds to a first gate electrode 4a as a gate electrode for a PMOS transistor while the section over the P-type region 19 (the broken-line region in FIG. 1) corresponds to a second gate electrode 4b as a gate electrode for an NMOS transistor. On the side of the line electrode, there is a gate sidewall 15. Within the semiconductor substrate, a source/a drain regions 5 are formed, sandwiching each of the first gate electrode 4a and the second gate electrode 4b, respectively.

The N-type region 18, the first gate insulating film 17, the first gate electrode 4a, the source/the drain region 5 and the gate sidewall 15 constitutes the PMOS transistor 2. The P-type region 19, the second gate insulating film 17, the second gate electrode 4b, the source/the drain region 5 and the gate sidewall 15 constitutes the NMOS transistor 1.

The line electrode 53 comprises two regions, that is, a silicide region (A) 51 comprising the first gate electrode 4a and a silicide region (B) 52 comprising the second gate electrode 4b, and these silicide regions (A) 51 and (B) 52 are in contact with each other over the isolation region 16. In the present invention, one of these silicide regions contains a metal-M silicide (a) having a larger metal-M atomic composition ratio (a content of the metal M in the metal-M silicide based on the number of atoms). The other silicide region comprises a silicide layer (C) on the plane contacting with the gate insulating film and the silicide layer (C) contains a metal-M silicide (b) having a smaller metal-M atomic composition ratio and a dopant element in such a concentration and a type that it prevents diffusion of the metal M in the other silicide region.

In a semiconductor device of the present invention, the NMOS transistor 1 and the PMOS transistor 2 may constitute a CMOS transistor (complementary MOS).

Figure 10:
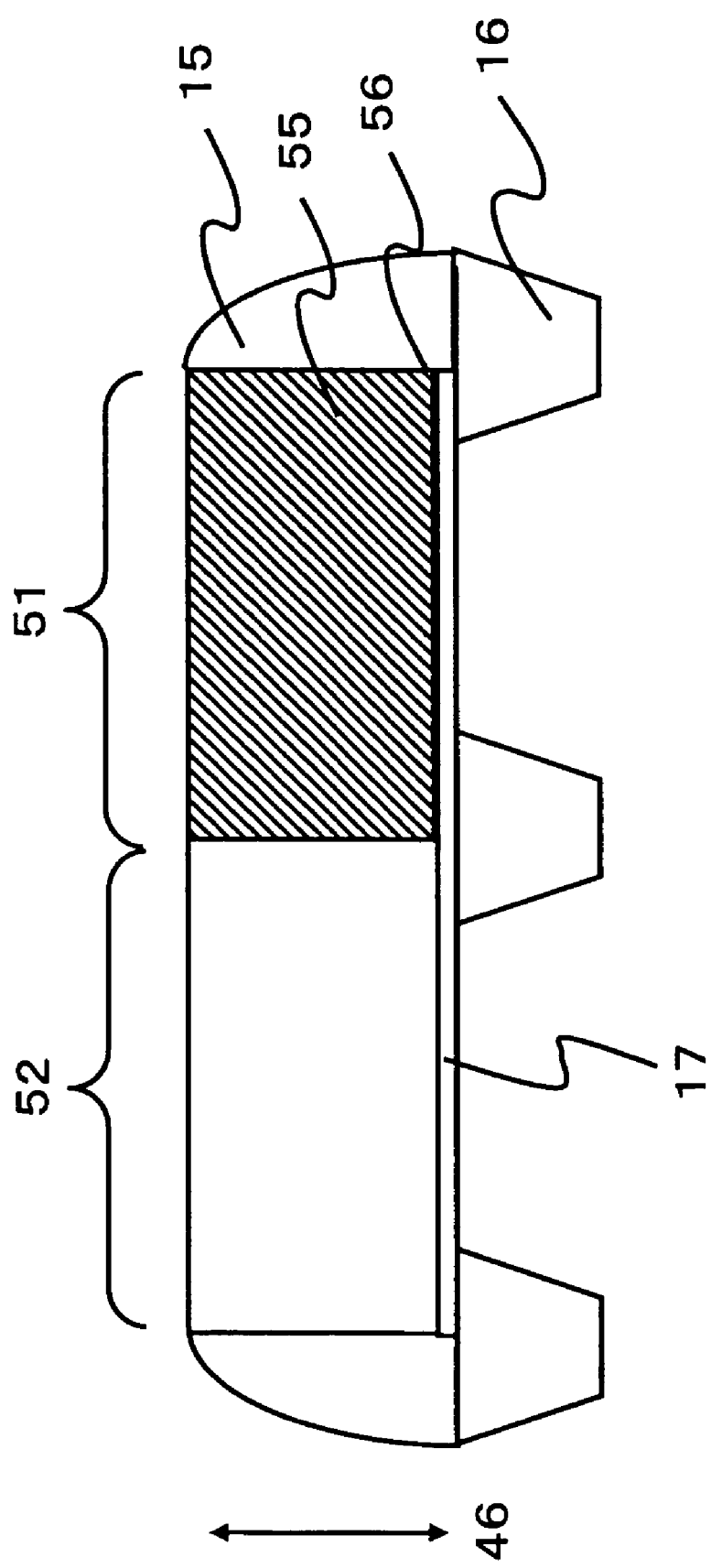
FIG. 10 shows an example of a line electrode of the present invention.

FIG. 10 schematically shows an example of this line electrode. In this line electrode, a silicide region (A) 51 comprises a silicide (b) and a silicide layer (c) 55 containing a dopant element (the broken-line region in the figure), and the silicide region (B) 52 contains a silicide (a). Depending on a manufacturing process and/or manufacturing conditions, a thin layer 56 having a larger dopant concentration than the silicide layer (C) 55 may be formed between the silicide layer (C) 55 and the gate insulating film 17. However, this layer 56 is too thin (typically, one to two atom layer) to significantly influence a work function of a gate electrode constituent material, and thus the silicide layer (C) over the thin layer is practically dominant in determining a work function. Therefore, the silicide layer (C) of the present invention does not contain such a layer 56, and even when such a layer 56 is present over the gate insulating film 17, a silicide layer (C) 55 is, herein, present in contact with the upper surface of the gate insulating film 17. These silicide layers (C) 55 and 56 can be determined by SIMS (secondary ion mass spectroscopy) as described later.

Furthermore, in the present invention, the silicide region (A) may correspond to the one silicide region while the silicide region (B) being the other silicide region comprising the above silicide layer (C). Alternatively, the silicide region (A) may correspond to the other silicide region comprising the above silicide layer (C) while the silicide region (B) being the one silicide region. Additionally, the dopant implanted into the silicide layer (C) which substantially prevent diffusion of the metal M in the silicide (b) may be of any conductivity type (it may be any type among N-type dopant, P-type dopant and neutral-type dopant without charge). The silicide layer (C) may contain at least one dopant selected from the group consisting of an N-type dopant, a P-type dopant and a neutral dopant.

Although the silicide layer (C) may constitute all or a part of the silicide region (A) or (B), it must be present at least in a part in contact with the gate insulating film of the silicide region (A) or (B). Furthermore, although the silicide layer (C) must contain at least a dopant element, a silicide region except the silicide layer (C) (of the one silicide region, a part except the silicide layer (C) in the other silicide region when the other silicide region partially contain the silicide layer (C)) may contain a dopant element as long as the effects of the present invention are not deteriorated. Furthermore, the silicide layer (C) may contain a dopant element other than the dopant substantially preventing diffusion of the metal M as long as it does not deteriorate the effects of the present invention. For example, when a layer to be a mask in implanting a dopant for a source/a drain region is not formed over the gate pattern during forming the source/the drain region, a dopant element is implanted into the gate pattern during implanting the dopant.

In a semiconductor device of the present invention, the suicide layer (C) can interact with the Hf-containing high-dielectric insulating film constituting the gate insulating film to allow an effective work function of the gate electrode to be modulated in a wide range. Furthermore, the silicide layer (C) contains a particular dopant element at a predetermined concentration, so that during heating such as forming a gate electrode, diffusion of the metal M from one silicide region to the silicide layer (C) can be prevented. Herein, a diffusion coefficient of the metal M in the silicide layer (C) is considerably influenced by a temperature (for example, a temperature during siliciding), but by appropriately selecting the type and a concentration of the dopant element, diffusion of the metal M can be prevented in the silicide layer (C) in any possible temperature in the process (a diffusion coefficient of the metal M in the silicide layer (C) can be made substantially "0").

In the present invention, even when the silicide layer (C) merely constitutes a part of the silicide region (A) or (B) (the other silicide region), the effects of the present invention can be achieved. The reason is why controllability and Fermi level pinning of a $V_{th}$ is mostly influenced by a part of the gate electrode directly over the gate insulating film and, when a composition of the gate electrode in contact with the gate insulating film is uniform, the effects of the present invention can be achieved. Thus, if there is the silicide layer (C) over the gate insulating film, its thickness (a length of the semiconductor substrate in a normal-line direction: for example, in FIG. 10, a length in a direction of the arrow 46) is preferably, but not limited to, 10 nm or more because an extremely small thickness may lead to insignificant influence to a work function.

Alternatively, the one silicide region is made of a metal-M silicide (a), while the other silicide region may be made of a metal-M silicide (b) and a dopant substantially preventing diffusion of the metal M in the silicide (b).

EFFECTS OF THE INVENTION

A semiconductor device of the present invention is characterized in that (a) gate insulating films in an NMOS transistor and a PMOS transistor comprises a Hf-containing high-dielectric insulating film as a layer in contact with gate electrodes, (b) a gate electrode for an NMOS and a gate electrode for a PMOS are made of suicides from the same elements with a different composition, and (c) of the gate electrode for an NMOS and the gate electrode for a PMOS, a silicide layer (C) in the gate electrode of a silicide having a smaller metal-M composition ratio contains a dopant to prevent diffusion of the metal M from one gate electrode.

In a semiconductor device of the present invention, these characteristics can synergistically act to give a semiconductor device in which each gate electrode for a MOS transistor has a uniform composition and a desired work function can be easily controlled. There will be described effects of each characteristic.

Effects of (a) and (b)

When using a silicon-containing gate electrode and a Hf-containing high-dielectric gate insulating film as constituent materials, contact of silicon in the gate electrode with the high-dielectric gate insulating film causes a phenomenon known as Fermi level pinning. Fermi level pinning is a phenomenon that a Fermi level is pinned to a certain energy level by interaction between silicon in the gate electrode and Hf in the gate insulating film in the interface between the silicon-containing gate electrode and the Hf-containing high-dielectric gate insulating film.

For example, when the gate electrode is made of polysilicon and the high-dielectric gate insulating film is made of HfSiON, a work function of the constituent material of the gate electrode is about 4.3 eV. On the other hand, when the gate electrode is a silicide made from a metal and silicon, an effective work function is a value between a work function of the metal element itself constituting the silicide and 4.3 eV, the work function in the case of a silicon gate electrode. The larger a Si composition ratio in the gate electrode is, the closer to 4.3 eV the effective work function is, while the larger a metal composition ratio is, the closer to the work function of the metal element the effective work function is. It is believed to be due to variation of a strength of Fermi level pinning depending on a Si composition ratio in the gate electrode, and thus, a work function can be controlled to a desired value by controlling a silicon composition ratio in the gate electrode for an NMOS and the gate electrode for a PMOS.

It will be more specifically described for the case where the metal M is Ni. When the high-dielectric gate insulating film is made of HfSiON, a work function is 5.0 eV for the case that the gate electrode for an NMOS and the gate electrode for a PMOS are made of Ni metal and 4.3 eV for the case that they are made of polysilicon. Among Ni silicides, three silicides having different compositions, that is, $Ni_3Si$ (Ni atomic composition ratio: 75%), NiSi (Ni atomic composition ratio: 50%) and $NiSi_2$ (Ni atomic composition ratio: 33%) have an effective work function of 4.8 eV, 4.5 eV and 4.4 eV, respectively, as shown in FIG. 2(a), indicating that the larger a Si composition ratio is, the closer to 4.3 eV (an effective work function of polysilicon) the effective work function is, while the larger an Ni composition ratio is, the closer to a work function of Ni, 5.0 eV (a work function of Ni metal), the effective work function is. A variation of an effective work function between these three Ni silicides is 4.8 eV–4.4 eV=0.4 eV as (maximum)–(minimum), indicating that an effective work function significantly varies depending on variation in a composition in the constituent material of the gate electrode.

The term, "effective work function" as used herein means a work function influenced by Fermi level pinning caused by interaction between a gate electrode constituent materials and a gate insulating film constituent material, which is different from a work function inherent to the gate electrode constituent material (a true work function), although depending on the gate insulating film constituent material, influence of Fermi level pinning to the work function is so insignificant that an effective work function may be substantially regarded as a true work function.

In contrast, when using $SiO_2$ as a gate insulating film, work functions for the cases where a gate electrode is made of $Ni_3Si$ (Ni atomic composition ratio: 75%), NiSi (Ni atomic composition ratio: 50%) or $NiSi_2$ (Ni atomic composition ratio: 33%), that is, a work function in a system without Fermi level pinning which is a true work function inherent to a material, are 4.65 eV, 4.6 eV and 4.57 eV, respectively, as shown in FIG. 2(b). A variation of a work function between these three Ni silicides is 4.65 eV–4.57 eV=0.08 eV as (maximum)–(minimum), indicating that a variation width of a work function in response to variation in a composition of a gate electrode constituent material is significantly smaller than 0.4 eV obtained in the case where HfSiON is used as a gate insulating film.

Thus, in terms of an effective work function of a silicide gate electrode, a modulation width of a work function for a gate electrode constituent material can be increased by using a Hf-containing high-dielectric insulating film as a gate insulating film and controlling a metal composition ratio in the silicide electrode to cause Fermi level pinning. As a result, a work function for a gate electrode constituent material can be controlled to a desired value.

Effects of (c)

For a semiconductor device as described above where a gate electrode for an NMOS and a gate electrode for a PMOS are made of silicides from the same elements with different compositions, uniformity of a silicide composition in each gate electrode for a MOS directly influences on a $V_{th}$ uniformity of a transistor (an ununiform silicide composition results in an ununiform $V_{th}$ of a transistor). This influence of compositional uniformity to $V_{th}$ uniformity becomes more significant when using a high-dielectric gate insulating film permitting Fermi level pinning. Thus, it is essential to precisely control a silicide composition ratio to a desired value.

A first effective method for the control of a composition ratio is the utilization of crystal phases inherent to a silicide, and a silicide composition can be controlled to a stoichiometry composition of a crystal phase by providing these crystal phases precisely in term of reproductivity and uniformity. For example, crystal phases inherent to an Ni silicide include $Ni_3Si$, $Ni_2Si$, $NiSi$ and $NiSi_2$ crystal phases, which can be selectively formed by adjusting the preparation conditions and thus, such technique is very effective for controlling a composition.

However, when such a gate electrode for an NMOS and a gate electrode for a PMOS with different silicide compositions are formed such that they are adjacent to each other within the line electrode described above, the problem of mutual diffusion between the gate electrode constituent materials during the steps of forming each gate electrode for a MOS and of heating after the formation step is significant.

For example, a gate pattern for a line electrode is formed from poly-Si (polysilicon), and then for giving a gate electrode for an NMOS and a gate electrode for a PMOS made of Ni silicides with different compositions, a thinner Ni layer is deposited over poly-Si to be a gate electrode for an NMOS while a thicker Ni layer is deposited over poly-Si to be a gate electrode for a PMOS. Then, they can be sintered at an appropriate temperature to form NiSi and $Ni_3Si$ as a gate electrode for an NMOS and a gate electrode for a PMOS, respectively. For these Ni silicides, a dominant diffusion element during siliciding is Ni, so that siliciding is promoted by Ni diffusion into poly-Si.

Figure 3:
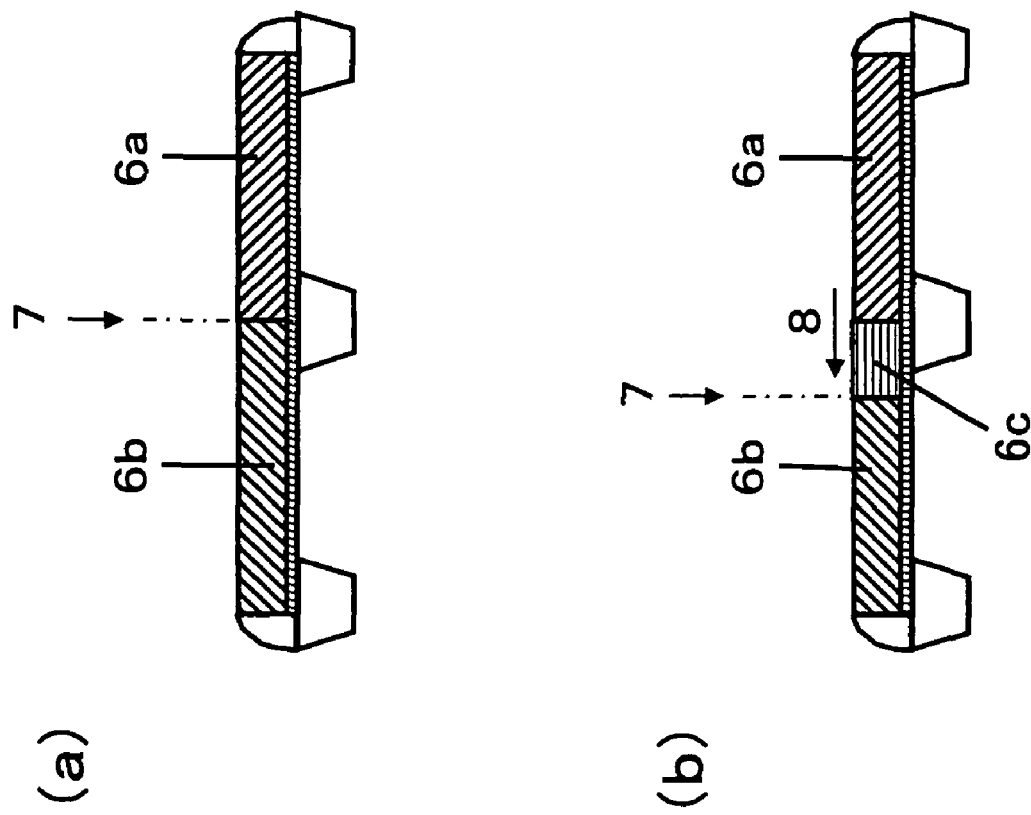
FIG. 3 illustrates a problem when silicide electrodes having different compositions are adjacent to each other.

In an ideal line electrode, it is preferable that a gate electrode constituent material 6b for an NMOS and a gate electrode constituent material 6a for a PMOS are formed uniformly from the end to the isolation region while each gate electrode constituent material for a MOS forms a steep interface 7 over the isolation region. Furthermore, it is preferable that through this interface 7, a material composition is drastically changed from the material composition of the gate electrode for an NMOS to the material composition of the gate electrode for a PMOS (FIG. 3(a)). However, in practice, since a gate electrode constituent material for an NMOS and a gate electrode constituent material for a PMOS are mutually adjacent within the line electrode, mutual diffusion between the gate electrodes constituent materials for a MOS generally occurs, leading to formation of a transition region 6C having a composition different from that of any of the gate electrode constituent materials for a MOS within the line electrode. Specifically, in an interface within the line electrode where a gate electrode made of NiSi and a gate electrode made of $Ni_3Si$ are in contact with each other, a slope generates in an Ni composition ratio and thus Ni diffuses to the NiSi side (the direction of the arrow 8) to form a transition layer 6c where an NiSi composition has been partly changed into a composition having a larger Ni composition ratio than NiSi (FIG. 3(b)).

Even if Ni diffusion from one gate electrode material to the other is limited within the line electrode over the isolation region during this step (even if the transition layer 6c is formed only over the isolation region), a later heating step (for example, forming gas annealing) may cause similar Ni diffusion. As a result, a composition of the gate electrode for a MOS made of NiSi (a silicide having a smaller Ni atomic composition ratio) may be partly changed to a composition having a larger Ni atomic composition ratio.

The above example relates to the case where NiSi and $Ni_3Si$ are simultaneously formed. Furthermore, even in a process where a gate electrode for an NMOS and a gate electrode for a PMOS are separately prepared, for example, forming NiSi as a gate electrode for an NMOS followed by forming $Ni_3Si$ as a gate electrode for a PMOS, Ni diffusion to a silicide having a smaller Ni atomic composition ratio may similarly occur.

To solve such a problem, we have conducted various investigations and have resultantly found that mutual diffusion between adjacent silicide regions comprising silicide gate electrodes with a different composition can be effectively prevented by incorporating a dopant in a silicide region with a smaller metal-M atomic composition ratio.

The phenomenon of prevention of mutual diffusion of gate electrode constituent materials by a dopant would be caused by difficulty in a replacement reaction between a metal diffused in a silicide and a dopant present in the silicide.

There will be described the phenomenon with reference to a case where Ni as a diffusing species diffuses in a B-containing NiSi crystal phase. Here, B is present at a lattice point in an NiSi crystal phase. Here, when Ni diffuses into this NiSi crystal phase, B at a lattice point is replaced with the diffusing Ni, and the replaced B is moved to the NiSi side opposite to the Ni-diffusion direction by dopant sweeping effect. Here, since a diffusion coefficient of B in NiSi is very smaller in comparison of that in poly-Si, B swept to an interface, as a result, would prevent Ni diffusion.

Utilizing this effect, in a semiconductor device comprising a line electrode where a silicide region having a smaller metal-M atomic composition ratio and a silicide region having a larger metal-M atomic composition ratio are adjacent to each other, the dopant contained in the silicide region having a smaller metal-M atomic composition ratio can prevent from diffusion of the metal M from the silicide region having a larger metal-M atomic composition ratio and thus, variation in a composition of the silicide having a smaller metal-M atomic composition ratio can be prevented.

Effect of $V_{th}$ deviation due to composition ununiformity in gate electrode constituent materials is largest in a composition near an interface between a gate electrode and a gate insulating film. Thus, the above prevention of metal-M diffusion by a dopant is most effective when incorporating a dopant in the gate electrode part over an interface between the gate electrode and the gate insulating film (silicide layer (C)).

The more significant such diffusion preventing effect is, the more a dopant swept is. Thus, when a dopant concentration in the silicide region having a smaller metal-M atomic composition ratio exceeds a certain level, the diffusion preventing effect becomes prominent. A dopant concentration at which this diffusion preventing effect becomes significant varies, depending on the type of a metal M constituting a silicide, a temperature when the metal M diffuses and the type of a dopant element.

That is, whether a dopant is effective in preventing diffusion of a metal M depends on compositions and structures (amorphous or crystalline) of a metal-M silicide (a) having a larger metal-M atomic composition ratio and a metal-M silicide (b) having a smaller metal-M atomic composition ratio, a temperature during siliciding and the type and a concentration of the dopant element. Specifically, a composition and a structure of the silicide (b) and the type of a dopant element can determine whether the dopant element tends to be trapped in the above silicide (b) (whether a metal M diffusing from a silicide (a) tends to replace the dopant element). Furthermore, compositions and structures of the silicides (a) and (b) can determine a heating temperature range during siliciding. Therefore, in the present invention, the diffusion prevention effect of the metal M can be obtained by incorporating an appropriate type of dopant element in the silicide (b) in an appropriate concentration range in the light of compositions of these suicides (a) and (b) and a possible temperature range in siliciding. Thus, the phrase "containing a dopant substantially preventing metal-M diffusion" as used herein, means that as described above, a dopant is contained in a silicide layer (C) in such a type and a concentration that diffusion of a metal M can be prevented.

More specifically, for Ni silicide, it is preferable that a dopant element is contained in a concentration of $1 \times 10^{20}$ $cm^{-3}$ in an NiSi crystal phase (silicide layer (C)) in a temperature range generally used in the siliciding step and the later transistor forming steps. The presence of the dopant within this concentration range allows the silicide layer (C) to be adequately effective in diffusion prevention and the siliciding to proceed in a practically acceptable rate. It is also preferable that a dopant element is contained in a concentration of $3 \times 10^{20}$ $cm^{-3}$ or more in the silicide layer (C). The presence of a dopant within this concentration range can effectively reduce a siliciding rate of a gate pattern to be the silicide layer (C). As a result, even when the one and the other silicide regions are simultaneously formed, metal-M silicides constituting the one silicide region and the silicide layer (C) can be separately formed as those with different compositions in an effective manner.

Such diffusion preventing effect varies depending on a dopant element swept by the metal M, and our investigation has demonstrated that B, As, F, C and N is particularly effective in such prevention. The reason would be why these elements tend to be constrained to a lattice point and are resistant to replacement with a diffusing metal M. Thus, in the present invention, a dopant element capable of effectively preventing diffusion can be at least one element selected from the group consisting of B, As, F, C and N.

As a dopant element, an N-type dopant, a P-type dopant and a neutral dopant can be used in combination or alone. For example, a dopant element may be B alone, As alone, or at least one selected from the group consisting of F, C and N.

For example, when an Ni silicide is a gate electrode constituent material for an NMOS and a gate electrode constituent material for a PMOS, a dopant-element concentration of $3 \times 10^{20}$ $cm^{-3}$ or more prevents diffusion of Ni from one gate electrode material to the other gate electrode material, indicating adequate effect.

It should be noted in the present invention that the effect of preventing metal-element diffusion by a dopant element does not depend on a conductivity type of a dopant added to a silicide (an N-type dopant, a P-type dopant and a neutral dopant without generating charge). That is, in the present invention, when a gate electrode for an NMOS is made of a silicide (a) while a gate electrode for a PMOS is made of a silicide (b), any of N-type, P-type and neutral-type dopants can be implanted into a silicide layer (C) in a gate electrode for a PMOS to prevent metal diffusion in the gate electrode for a PMOS. Furthermore, when a gate electrode for an NMOS is made of a silicide (b) while a gate electrode for a PMOS is made of a silicide (a), any of N-type, P-type and neutral-type dopants can be implanted into a silicide layer (C) of a gate electrode for an NMOS to prevent metal diffusion in the gate electrode for an NMOS.

All the above results relate to the effect of preventing Ni diffusion by a dopant in an NiSi crystal phase, but similar effects may be expected in an $NiSi_2$ crystal phase. Furthermore, similar effects can be expected in, for example, Pt silicide, Co silicide and Pd silicide where a metal is a main diffusing species.

It is preferable in the present invention that a silicide region (A) is the one silicide region and a silicide (a) contained in the one silicide region is Ni silicide with an Ni atomic composition ratio of 60% or more. Furthermore, it is preferable that a silicide region (B) is the other silicide region and a silicide (b) contained in a silicide layer (C) of the other silicide region is Ni silicide with an Ni atomic composition ratio of less than 60%. More preferably, a silicide (a) is made of an $Ni_3Si$ crystal phase or $Ni_2Si$ crystal phase, while a silicide (b) is made of an NiSi crystal phase or $NiSi_2$ crystal phase. Forming the silicides (a) and (b) from certain Ni silicides with a different Ni atomic composition ratio can facilitate controlling work functions and $V_{th}$s of a gate electrode constituent material for an NMOS and a gate electrode constituent material for a PMOS to desired values.

In a gate insulating film of the present invention, it is necessary that there is a Hf-containing high-dielectric insulating film at least in a part in contact with a gate electrode. Herein, a high-dielectric insulating film (a high-K film) refers to an insulating film having a higher charging rate than a silicon oxide film. Combination of a Hf-containing high-dielectric insulating film with a silicide allows for controlling a work function over a wide range by interaction between the high-dielectric insulating film and the silicide (Fermi level pinning).

Examples of a Hf-containing high-dielectric insulating film which can be used include HfSiO, HfSiON, HfZrSiO, HfZrSiON, HfAlO, HfAlON, HfZrAlO and HfZrAlON. A Hf-containing high-dielectric insulating film may be combined with a Hf-free gate insulating film to form a laminate structure, and in such a case, there must be a gate insulating film such that at least a part in contact with a gate electrode contains a Hf-containing high-dielectric insulating film.

2. Process for Manufacturing a Semiconductor Device

There will be detailed each step of a manufacturing process for a semiconductor device of the present invention.

A constituent material of a gate pattern as a basic framework of a silicide gate electrode may be, for example, a polysilicon layer or amorphous silicon layer. There will be described, as an example, a case where a polysilicon layer is used as a constituent material for a gate pattern.

First, a semiconductor substrate comprising an N-type region and a P-type region isolated by an isolation region is prepared. Next, on the semiconductor substrate is formed a gate insulating film comprising a Hf-containing high-dielectric insulating film as an uppermost surface layer (the highest layer in a direction of a normal line of the semiconductor substrate; a layer opposite to the side in contact with the semiconductor substrate), and then a polysilicon layer is formed on this gate insulating film and a dopant for preventing diffusion of a metal is implanted to a part which is to be a silicide gate electrode having a smaller metal atomic composition ratio. The dopant may be implanted by ion implantation.

Due to dopant sweeping effect while siliciding proceeds in the later step of forming a gate electrode, a dopant concentration in some part of a silicide layer (C) in the gate electrode may be lower than a dopant concentration in the polysilicon layer in implanting the dopant preliminarily. Thus, in implanting the dopant, it is preferable that the dopant is implanted in such an amount that the dopant concentration in the silicide layer (C) of the gate electrode after siliciding is higher than $3 \times 10^{20}$ cm$^{-3}$, estimating the above variation in a dopant concentration during the gate electrode formation.

After this implantation, on the polysilicon layer is formed a dopant-implantation preventing layer to be a mask to dopant implantation in the polysilicon layer during implanting a dopant for forming a source/a drain regions. Next, the polysilicon layer and the dopant-implantation preventing layer are processed by lithography, to form a gate pattern comprising a polysilicon region and a dopant-implantation preventing mask formed over the polysilicon region. Subsequently, after forming a gate sidewall and implanting a dopant for forming a source/a drain regions, the product is heated for activating the implanted dopant. Here, the heating activates the dopant for preventing diffusion of the metal implanted into the gate pattern and the like and the dopant implanted for a source/a drain regions (FIG. 4(*a*)).

Next, a silicide 22 is formed on the exposed source/drain regions, an interlayer insulating film 21 is formed such that it covers the whole surface of the element device, and then the interlayer insulating film 21 is removed by CMP to expose the dopant-implantation preventing mask over the gate patterns of the polysilicons 12 and 13.

Next, the dopant-implantation preventing mask over the gate pattern is removed to expose the upper surface of the polysilicon constituting the gate pattern, on which is deposited a metal M layer in whose upper surface a silicide can be formed. Here, it is typically unnecessary to change a thickness of the metal M layer between the part on the gate pattern over the N-type region and the part on the gate pattern over the P-type region, and one step deposits a film thickness required for giving any one of the gate patterns with a silicide composition with a larger metal atomic composition ratio (FIG. 4(*b*)).

Thus, even when a film thickness of the deposited metal M is equal between the part over the gate pattern expected to have a larger metal atomic composition ratio and the part over the gate pattern expected to have a smaller metal atomic composition ratio, a dopant for preventing Ni diffusion has been preliminarily implanted in the gate pattern expected to have a smaller metal atomic composition ratio. Thus, replacement of the dopant with Ni is inhibited during this siliciding. This dopant is, therefore, effective in reducing a siliciding reaction rate and in preventing proceeding of the siliciding during gate pattern siliciding.

In other words, the amount of the metal diffusing into Si in a certain period is larger in the gate pattern without the dopant for preventing Ni diffusion than in the gate pattern implanted with this dopant. The gate pattern without the dopant, therefore, becomes a silicide with a larger metal atomic composition ratio than the gate pattern implanted with the dopant. Therefore, by appropriately selecting a sintering temperature and a time, there can be simultaneously formed a silicide gate electrode having a larger metal atomic composition ratio in the gate pattern without a dopant (the gate pattern expected to have a larger metal atomic composition ratio) and a silicide gate electrode with a smaller metal atomic composition ratio in the gate pattern implanted with a dopant (the gate pattern expected to have a smaller metal atomic composition ratio) (FIG. 4(*c*)). Furthermore, in the step, diffusion of Ni to be a diffusing species in the direction of 8 is prevented, resulting in formation of an interface 7 between the silicide regions (A) and (B) over the isolation region.

Since in a gate pattern implanted with a dopant, a dopant concentration distribution is generated in its thickness direction during siliciding, a gate electrode after preparation may not have a uniform metal-M silicide composition depending on the conditions of siliciding and the type and the amount of the dopant element, resulting in variation in a metal-M silicide composition in the thickness direction. Even when a metal-M silicide composition and a dopant concentrations vary in the thickness direction as described above, any region can be herein defined as a silicide layer (C) as long as it contains a metal-M silicide (b) with a smaller metal-M atomic composition ratio than one silicide region (A) and a dopant substantially preventing diffusion of the metal M and is in contact with a gate insulating film.

Figure 4:
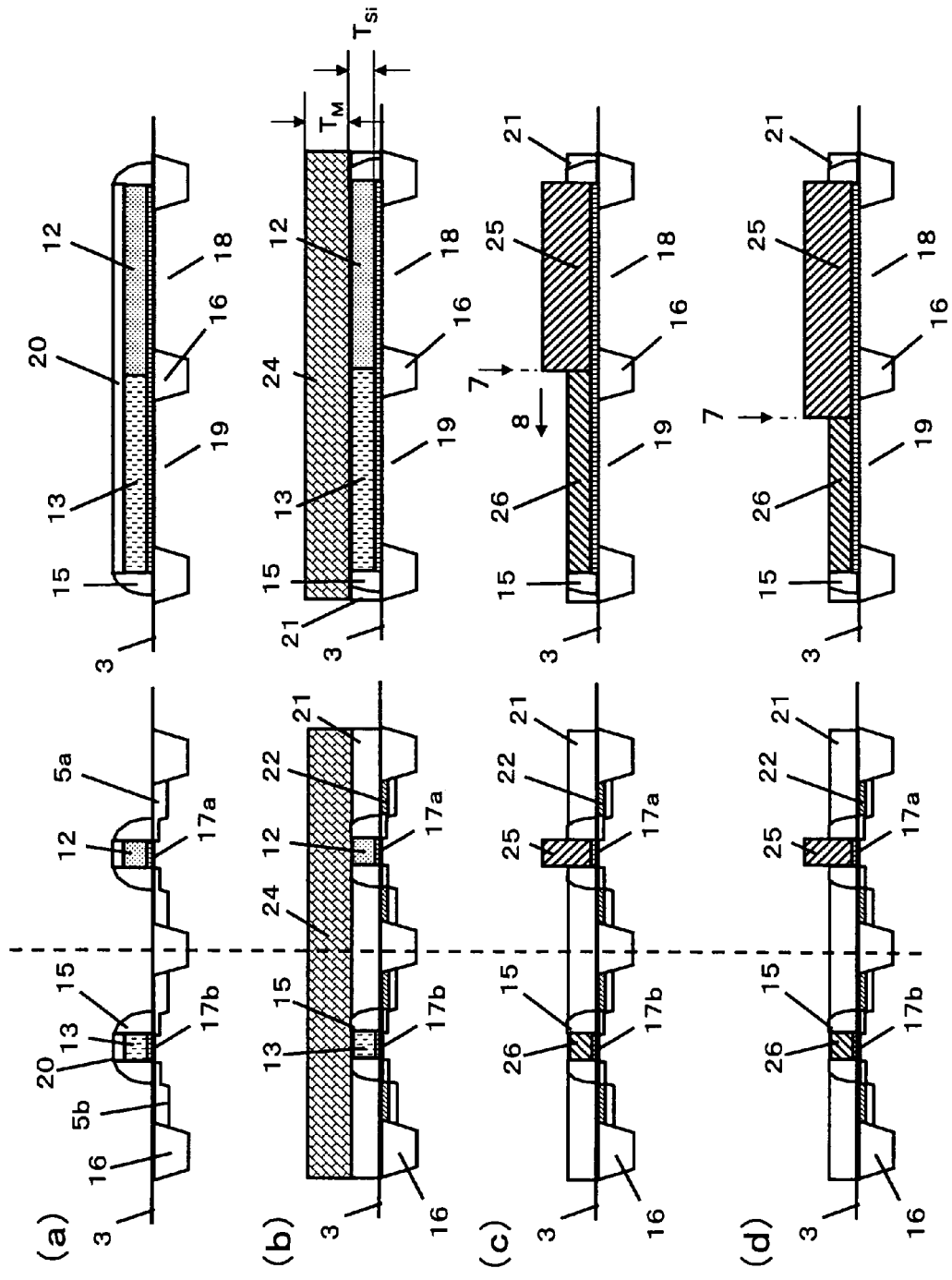
FIG. 4 illustrates an example of a manufacturing process for a CMOS transistor of the present invention.

When a region silicided by a conventional manufacturing process contains a dopant, the dopant is swept to an interface in the gate insulating film side in the gate electrode during the siliciding. Thus, a dopant concentration in a silicide constituting a gate electrode is generally lower than a concentration at the time of dopant implantation except the interface in the gate insulating film side. Therefore, in such a conventional manufacturing process for a gate electrode, when heating is further continued in the state of FIG. 4(*c*) and/or a heating process is experienced in a subsequent separate step, a metal M diffuses from a silicide region with a larger metal atomic composition ratio to a silicide region with a smaller metal atomic composition ratio as shown in FIG. 4(*d*), leading to formation of a part with an ununiform silicide composition in the gate electrode.

In contrast, since a high concentration of dopant is preliminarily implanted in a gate pattern in the present invention, a dopant remains in a high concentration in an Si-rich silicide gate electrode, at least in a silicide layer (C) even after the dopant is swept. Therefore, even when heating is further continued in the state of FIG. 4(*c*), metal diffusion is prevented in a silicide having a smaller metal atomic composition ratio, resulting in maintenance of the state of FIG. 4(*c*).

Figure 5:
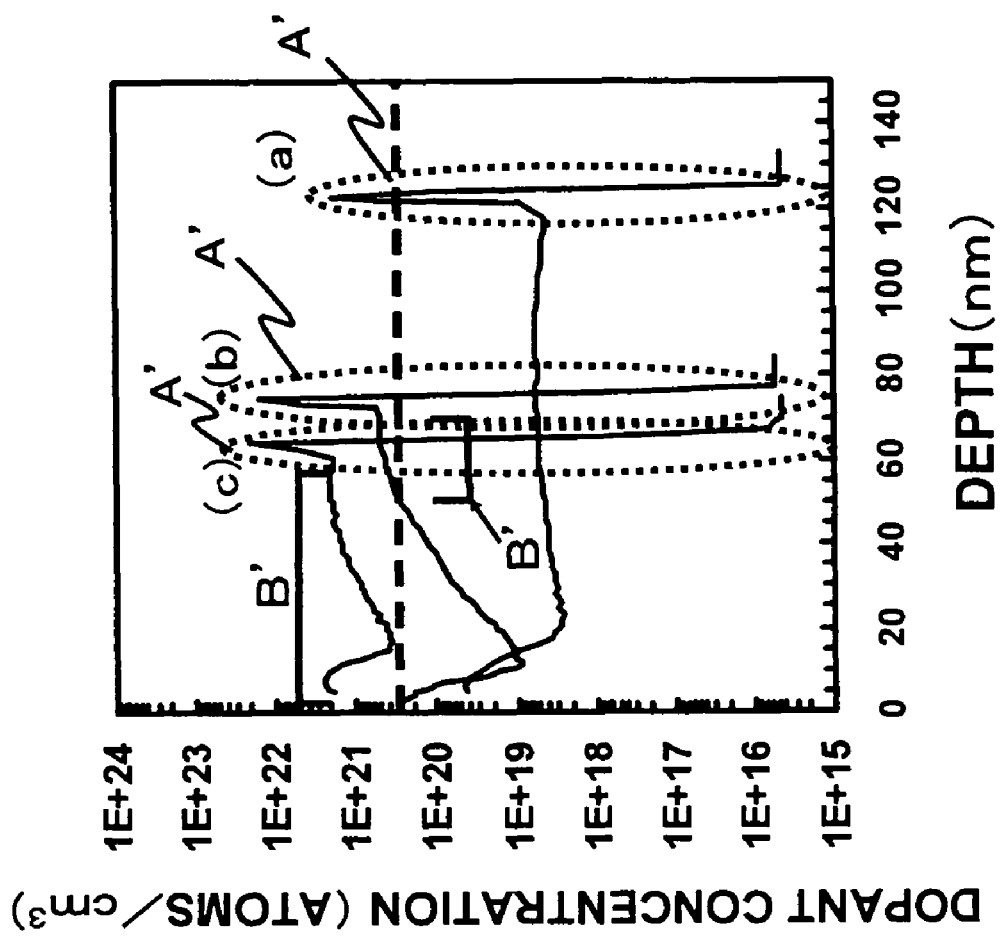
FIG. 5 shows a dopant profile within a silicide gate electrode of the present invention.

FIG. 5 shows a typical example of a profile for a dopant implanted in a gate electrode after siliciding. FIG. 5 illustrates a dopant-element concentration distribution in a thickness direction of the other silicide region containing a silicide with a smaller metal atomic composition ratio after siliciding (a normal-line direction of a semiconductor substrate; for example, the direction of the arrow 46 in FIG. 1(*b*)), as determined by SIMS (secondary ion mass spectroscopy). The dopant was As. This determination by SIMS was conducted by analysis of an NMOS transistor in its thickness direction by injecting primary ions while etching a sample from the semiconductor substrate side, using Cs as the primary ions. The part of a depth 0 nm in the abscissa in FIG. 5 represents the surface in the side where the metal M was deposited in the gate electrode (the side opposite to the side in contact with the gate insulating film). That is, in FIG. 5, it is the surface in the side where the metal M layer was deposited (data was processed such that a depth 0 nm is the level of the uppermost surface opposite to the gate insulating film side of the gate electrode). In any of FIGS. 5(*a*) to (*c*), there is observed a peak A' with a high dopant concentration in the right end of the graph. In the semiconductor devices of FIGS. 5(*a*) to (*c*), a gate electrode has a thickness corresponding to a depth of the right end of the peak A' (the right end of the graph represents the part in contact with the gate insulating film of the gate electrode).

Due to the following reason, a gate electrode thickness is different between FIGS. 5(a) to (c) as described above. That is, FIGS. 5(a) to (c) represent gate electrodes implanted with a dopant in an increased amount in sequence. As described above, the higher a dopant concentration in the gate electrode is, the harder initiation of silicidation is, resulting that a gate electrode is easy to be made of a silicide having a smaller metal atomic composition ratio. As a result, expansion of a gate electrode during silicidation becomes smaller and a thickness of the gate electrode is reduced. On the other hand, the smaller a dopant concentration in a gate electrode is, the easier initiation of silicidation is, resulting that a gate electrode is easy to be made of a silicide having a larger metal atomic composition ratio. As a result, expansion of a gate electrode during silicidation becomes larger and a thickness of the gate electrode is increased. As described above, difference in a thickness of a gate electrode after formation depending on a dopant concentration in the gate electrode is due to influence of a dopant concentration on a silicidation rate and a metal-M silicide composition.

A peak A' in FIGS. 5(a) to (c) indicates that a dopant swept to the gate insulating film interface in the gate electrode piles up (localized) after silicidation. Furthermore, it is found that there is also a part with a high dopant concentration in the side of the gate electrode surface (near the part of a depth 0 nm).

Here, in $V_{th}$ control by controlling a work function of a gate electrode, a part in contact with a gate insulating film in the gate electrode is important and this part is most influential to a $V_{th}$ of the gate electrode. It is, therefore, necessary to make a composition uniform at least in the part in contact with the gate insulating film in the gate electrode for controlling a $V_{th}$. However, a peak A' in FIGS. 5(a) to (c) has no influence on $V_{th}$ control, and thus can be ignored in the present invention. The reason is why the dopant swept to the gate insulating film interface is so thin (typically 1 to 2 atom layer) that a high dopant concentration in this layer has substantially no influence on a silicide composition ratio during forming the gate electrode. Therefore, hereinafter, I will focus on a dopant concentration in a region over the layer represented by a peak A' in the gate electrode. Furthermore, herein, even when there is a layer represented by a peak A' over the gate insulating film, it can be assumed that ignoring this layer, a silicide layer (C) is present over the gate insulating film while contacting with the gate insulating film.

In the semiconductor device of FIG. 5, it is found from the compositions of the gate electrode for an NMOS and the gate electrode for a PMOS as well as the type of a dopant element that when using As as a dopant, a dopant concentration of $3\times10^{20}$ cm$^3$ or more the diffusion of the metal M can adequately be prevented. Thus, from the SIMS in FIG. 5, a part having a dopant concentration of $3\times10^{20}$ cm$^{-3}$ or more can be at least regarded as a silicide layer (C).

For example, in the case of FIG. 5(a), a dopant concentration is less than $3\times10^{20}$ cm$^{-3}$ in all the regions except the part of the peak A' in the gate electrode. Thus, diffusion of metal element may be inadequately prevented, leading to increase in a metal composition in a gate electrode having a smaller metal-M atomic composition ratio. In FIG. 5(a), a dopant concentration due to piling up in the interface between the gate electrode and the gate insulating film is $3\times10^{20}$ cm$^{-3}$ or more, but in practice, this region is very thin, generally about 1 nm. Therefore, it does not contribute to the effects of the present invention and even if there is the layer, it cannot adequately prevent diffusion of the metal element (FIG. 6(a)). Thus, in the present invention, a dopant concentration in this layer is ignored.

In contrast, for FIG. 5(c), a dopant concentration is $3\times10^{20}$ cm$^{-3}$ or more in the whole region B' including an interface between the gate electrode and the gate insulating film (the downward-sloping part at the right end of the peak A' in FIG. 5(c) is a part in contact with the gate insulating film, but can be ignored in the present invention). Thus, the whole region (a part with a dopant concentration of $3\times10^{20}$ cm$^{-3}$ or more) is a silicide layer (C) (the part indicated by B' in the graph), where diffusion of a metal element can be prevented by a dopant, resulting in maintaining uniformity in a composition of a silicide having a smaller metal atomic composition ratio (FIG. 6(c)).

For FIG. 5(b), there is a part with a dopant concentration of less than $3\times10^{20}$ cm$^{-3}$ near the surface in the side of the deposited metal-M layer in the gate electrode (the side opposite to the side in contact with the gate insulating film of the gate electrode), and a dopant concentration is sometimes insufficient for preventing diffusion of a metal element. There is, however, a region with a concentration of $3\times10^{20}$ cm$^{-3}$ or more in the side of the interface between the gate electrode and the gate insulating film, and this region (the part indicated by B' in the graph) becomes at least a silicide layer (C). Thus, this silicide layer (C) can maintain uniformity in a composition of a silicide having a smaller metal atomic composition ratio (FIG. 6(b)).

As described above, in the case of FIG. 5(b), all of the region in the gate electrode may not be a silicide layer (C), but at least the part in contact with the gate insulating film in the gate electrode is a silicide layer (C), in which a silicide composition with a smaller metal atomic composition ratio is maintained. Thus, particularly focusing on an effective work function, the case of FIG. 5(b) is equivalently effective in comparison with the case of FIG. 5(c).

In the above manufacturing process, there has been described an example where after implanting a dopant in a polysilicon gate pattern, is formed a dopant-implantation preventing mask which is to be a mask during implanting a dopant for a source/a drain regions into the polysilicon gate pattern. Thus, such a dopant-implantation preventing mask is formed mainly because when implanting a dopant for a source/a drain regions, the dopant may be implanted into a gate pattern expected to have a larger metal-M atomic composition ratio so that a siliciding reaction rate is too reduced to provide a desired silicide having a larger metal-M atomic composition ratio.

Figure 6:
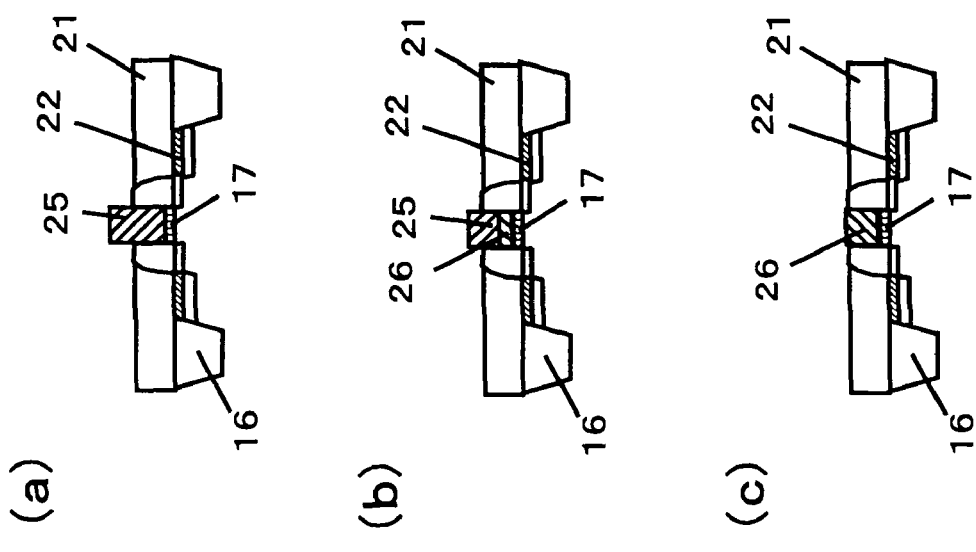
FIG. 6 shows a structure within a silicide gate electrode of the present invention.

After intense investigation, I have, however, found that as shown in FIG. 6(a), when a dopant concentration after silicide formation is less than $1\times10^{20}$ cm$^{-3}$, a silicide having a desired composition can be formed even if a gate pattern expected to have a larger metal-M atomic composition ratio contains a dopant in a certain concentration. Therefore, it is sufficient that the amount of a dopant implanted during forming a source/a drain regions is controlled to regulate a dopant concentration to less than $1\times10^{20}$ cm$^{-3}$ in the gate electrode after silicide formation. Here, a gate electrode containing a desired silicide having a larger metal-M atomic composition ratio of the present invention can be formed even when during dopant implantation into a source/a drain regions, a dopant is implanted into a gate pattern without forming a dopant-implantation preventing mask over the gate pattern.

There will be further detailed embodiments of the present invention.

Embodiment 1

Figure 7:
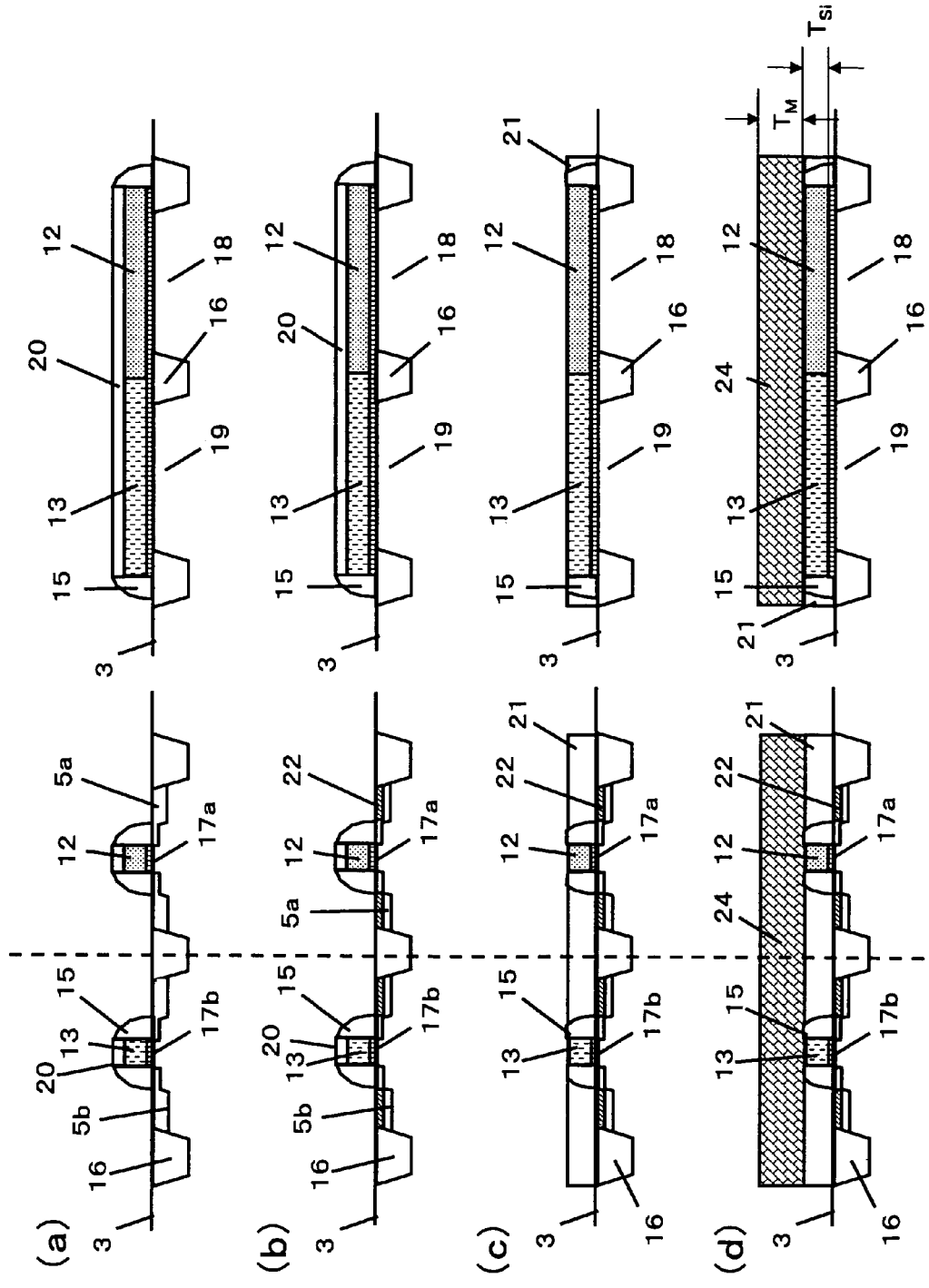
FIG. 7 illustrates embodiment 1 of a silicide gate electrode of the present invention.
Figure 8:
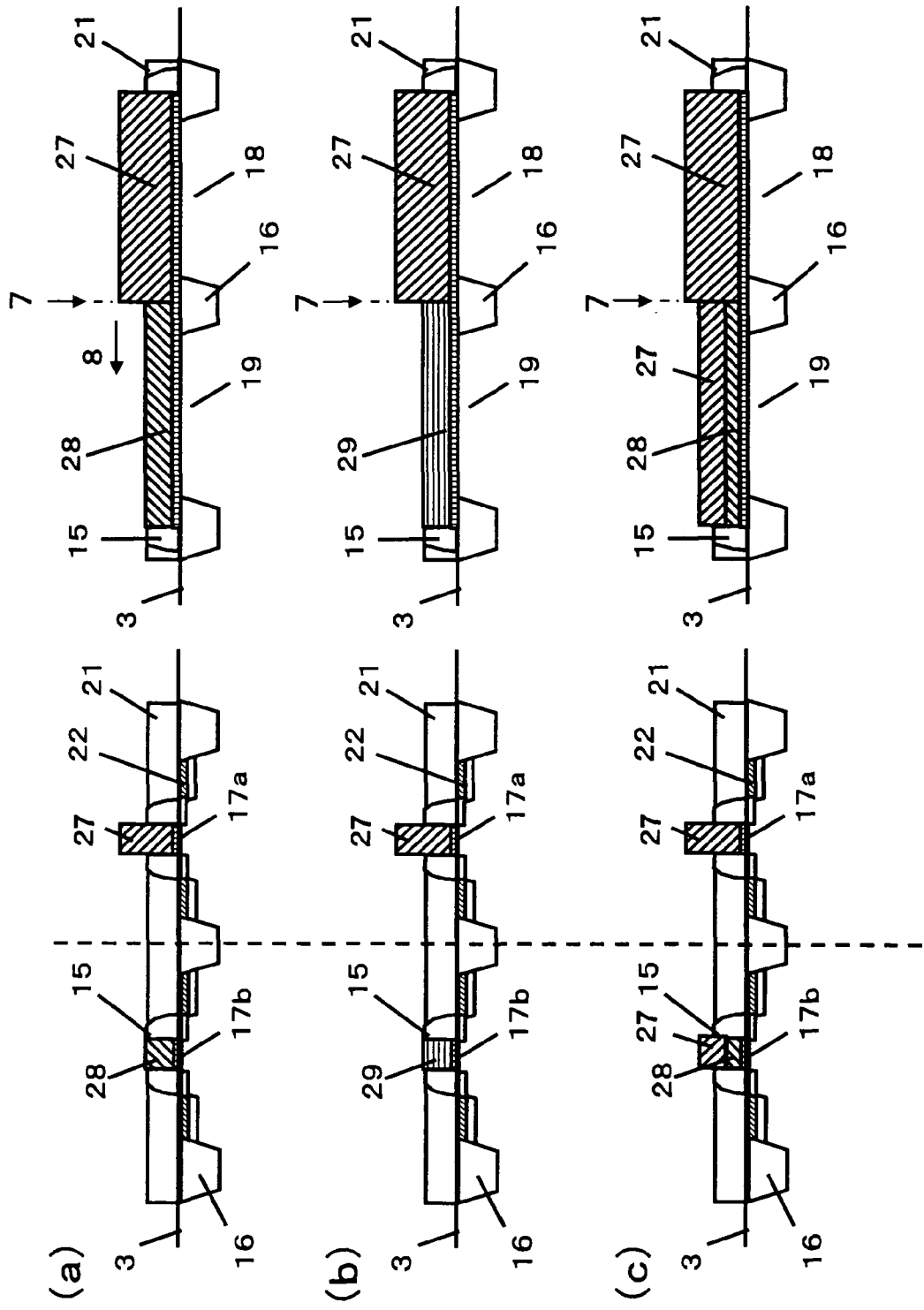
FIG. 8 illustrates embodiment 1 of a silicide gate electrode of the present invention.
Figure 9:
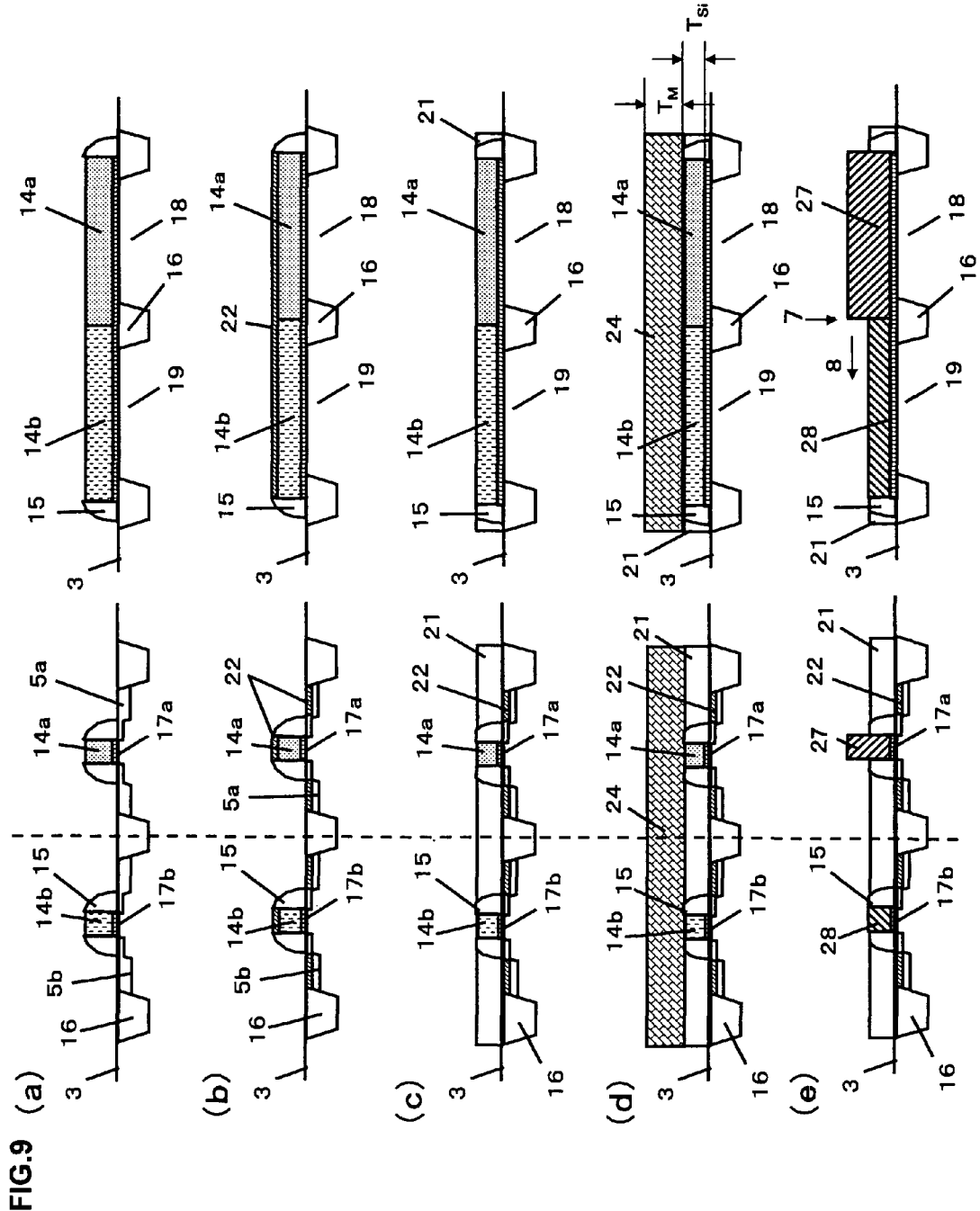
FIG. 9 illustrates embodiment 3 of a silicide gate electrode of the present invention.

The first embodiment of the present invention will be described with reference to FIGS. 7 and 8. First, a silicon substrate 3 was prepared, comprising an N-type region (N well) 18 and a P-type region (P well) 19 mutually isolated by a STI (Shallow Trench Isolation) isolation region 16 in a surface region.

Then, a film consisting of a silicon oxide film was formed over the surface of a silicon substrate 3 by thermal oxidation. Then, a HfSiO film was deposited by MOCVD and then nitrided/annealed under an $NH_3$ atmosphere at 900° C. for 10 min, to obtain a gate insulating film 17 (17a, 17b) consisting of a 2 nm HfSiON film. Here, a gate insulating film is not limited to a HfSiON film, but may be any Hf-containing high-dielectric insulating film made of, for example, HfSiO, HfSiON, HfZrSiO, HfZrSiON, HfAlO, HfAlON, HfZrAlO and HfZrAlON.

Then, a polysilicon layer of a thickness of 60 nm was formed on the gate insulating film 17. Then, a resist mask was formed in a part 12 in this polysilicon layer over the N-type region (N well), and B ions were implanted only into a part 13 over the P-type region (P well) 19 with an implantation area density of $1\times10^{16}$ cm$^{-2}$. After removing the resist mask, a silicon oxide film of a thickness of 40 nm was further deposited on the polysilicon layer. Next, by processing by means of lithography and RIE (Reactive Ion Etching), was formed gate patterns 12 and 13 made of polysilicon extending from the region over the N-type region through the region over isolation region to the region over the P-type-region as well as a hard mask (dopant-implantation preventing mask) 20.

Next, a dopant was implanted using the gate patterns 12 and 13 and the hard mask 20 as a mask to form an extension diffusion layer region in a self-aligned manner. Furthermore, a silicon oxide film was deposited and then was etched back to form a gate sidewall 15 in the side wall of the polysilicon layer. In this state, ions were again implanted to the semiconductor substrate region to be a source/drain region 5 (FIG. 7(a)). Here, since the hard mask 20 was present, ion implantation to the polysilicon gate pattern was blocked. Thus, the polysilicon gate pattern 13 over the P-type well (P well) 19 contained B implanted before the processing of the gate pattern. Subsequently, annealing for activation was conducted for concentration equalization and activation by diffusion of B and a dopant for the source/drain region in the gate pattern. On the other hand, the polysilicon gate pattern 12 over the N-type region (N well) 18 (PMOS region) did not contain a dopant implanted for preventing metal diffusion.

Then, a metal film was deposited over the whole surface by sputtering, and by salicide technique, a silicide layer 22 was formed only over the source/drain region using the gate sidewall 15 and the STI 16 as a mask (FIG. 7(b)). This silicide layer 22 was made of Ni monosilicide (NiSi) which can have a minimized contact resistance. As the silicide layer, the Ni silicide may be substituted by Co silicide or Ti silicide.

Furthermore, by CVD (Chemical Vapor Deposition), an interlayer insulating film 21 consisting of a silicon oxide film was formed. This interlayer insulating film 21 and the hard mask over the gate pattern were planarized by CMP, to expose the upper surfaces of the polysilicon gate patterns 12 and 13 (FIG. 7(c)). Then, an Ni layer 24 of a thickness of 120 nm was deposited to over the whole surface by sputtering (FIG. 7(d)).

Next, the Ni layer 24 was reacted with the polysilicon gate patterns 12 and 13 under an $N_2$ atmosphere at 370° C. for 5 min. Here, in the polysilicon gate pattern 13 over the P-type region (P well) 19, a silicidation rate was reduced due to the implanted dopant B, to give Ni silicide entirely comprising an $NiSi_2$ crystal phase 28.

On the other hand, in the polysilicon gate pattern 12 over the N-type region (N well) 18 without being implanted with a dopant, general silicidation proceeded to form Ni silicide entirely comprising an $Ni_3Si$ crystal phase 27 (FIG. 8(a)). Here, diffusion of Ni to be a diffusing species in the direction of 8 was prevented to form an interface 7 between the silicide regions (A) and (B) over the isolation region.

This is because the implanted B prevents proceeding of the siliciding reaction and a certain concentration or more of B remaining within the gate electrode after silicidation prevents a composition of the $NiSi_2$ crystal phase from being Ni-rich. Here, a dopant concentration in the silicide region in the $NiSi_2$ crystal phase was, as the minimum, $3.5\times10^{20}$ cm$^{-3}$ as determined by SIMS.

In siliciding of nickel, a composition of a nickel silicide obtained depends on a film thickness of an Ni layer deposited on the polysilicon, a silicidation temperature and a B concentration in the polysilicon gate pattern. In this embodiment, a film thickness of an Ni layer and a silicidation temperature were selected such that an $NiSi_2$ crystal phase was formed in the side of the interface between the gate electrode and the gate insulating film over the P-type region (P well) 19 while an $Ni_3Si$ crystal phase was formed in the whole gate electrode over the N-type region (N well) 18. Specifically, a reaction temperature of this nickel silicidation is preferably 330° C. or more and 450° C. or less. A film thickness $T_M$ of the Ni layer deposited on the polysilicon is preferably adequate for forming an $Ni_3Si$ crystal phase over the N-type region (N well) 18 (1.65-fold or more of a thickness $T_{Si}$ of the polysilicon constituting the gate pattern: $T_M/T_{Si} \geq 1.65$).

A $V_{th}$ was measured for each transistor thus formed, comprising the gate electrode for an NMOS comprising the $NiSi_2$ crystal phase near the gate insulating film and the gate electrode for a PMOS comprising the $Ni_3Si$ crystal phase, giving 0.35 V for the gate electrode for an NMOS and −0.35 V for the gate electrode for a PMOS. These values corresponded to $V_{th}$s obtained assuming that effective work function were 4.4 eV (an effective work function of the $NiSi_2$ crystal phase) and 4.8 eV (an effective work function of the $Ni_3Si$ crystal phase), respectively.

Here, when mutual diffusion occurs between the gate electrode for an NMOS and the gate electrode for a PMOS during formation of the gate electrodes, a $V_{th}$ obtained is deviated from the $V_{th}$ expected from the composition. However, such a deviation was not found in the present invention. It was thus confirmed from the electric properties that mutual diffusion did not occur between the $NiSi_2$ crystal phase and the $Ni_3Si$ crystal phase constituting adjacent gate electrodes. The semiconductor device prepared as described above was measured in the same manner after annealing under $N_2$ at 450° C. for 10 min, indicating no variation in a $V_{th}$. It was thus confirmed that in a gate electrode formed in this example where the $NiSi_2$ crystal phase and the $Ni_3Si$ crystal phase were adjacent to each other, mutual diffusion between the constituent materials for the gate electrodes did not occur during heating at 450° C. or lower after forming the transistor.

The Ni silicide crystal phase over the P-type region (P well) 19 is closely related to a concentration of a dopant implanted into a gate electrode and a temperature of a silicidation reaction, and at a certain reaction temperature, a larger dopant implantation amount tends to give a smaller metal atomic composition ratio. Furthermore, in a certain dopant implantation amount, a lower reaction temperature during silicidation tends to give a smaller metal atomic composition ratio.

For example, when the whole gate electrode for an NMOS is made of an NiSi crystal phase (FIG. 8(b)), it can be formed either by reducing a B implantation amount to a gate electrode to $5\times10^{15}$ cm$^{-2}$ or setting a gate-electrode silicidation temperature to 420° C.

Furthermore, when an $NiSi_2$ crystal phase is formed only in the part in the side in contact with the gate insulating film 17 in the gate electrode for an NMOS while an $Ni_3Si$ crystal phase is formed in the other part (FIG. 8(c)), an effective work function can be also controlled to a desired value (corresponding to FIG. 6(b)). For example, such a gate electrode can be formed by reducing the amount of implanted B into the gate electrode to $7\times10^5$ cm$^{-2}$.

The gate electrode over the P-type region (P well) 19 may be made of an Ni—Si alloy without a particular crystal phase, whose composition is richer in Si than an NiSi$_2$ crystal phase. An effective work function in such a region is 4.3 eV to 4.4 eV as seen in FIG. 2, and even when a constituent material for the gate electrode is not made of a crystal phase, variation in an effective work function is so small and practically acceptable. For forming an Ni—Si alloy having such a small metal atomic composition ratio, for example, a silicidation temperature of the gate electrode can be lowered to 330° C.

A Ni silicide crystal phase over the N-type region (N well) 18 depends on a silicidation reaction temperature, and generally an Ni$_2$Si crystal phase is formed at a temperature lower than 320° C. while an Ni$_3$Si crystal phase is formed at 320° C. or higher and 650° C. or lower. When forming an Ni$_2$Si crystal phase, for example, it can be formed by controlling a silicidation reaction temperature to 240° C. or higher and less than 320° C. A film thickness of the Ni layer formed over the gate pattern ($T_M$) is preferably 1.1-fold or more of a thickness of a polysilicon constituting the gate pattern ($T_{Si}$) (that is, $T_M/T_{Si} \geq 1.1$).

As a variation of this embodiment, when a dopant element implanted into the gate pattern over the P-type region (P well) 19 made of a polysilicon formed as a gate pattern is As, substantially equivalent effects to the case of B implantation can be also obtained by implantation to a 60 nm polysilicon gate pattern with an area density of $1\times10^{16}$ cm$^{-2}$.

Embodiment 2

The second embodiment of the present invention is a variation of Embodiment 1, and is different from Embodiment in that a dopant element F is implanted at $6\times10^{15}$ cm$^{-2}$ to the gate pattern 13 over the polysilicon P-type region (P well) 19.

As described in Embodiment 1, a gate pattern is formed. Next, an Ni layer of a thickness of 120 nm is deposited over the whole surface by sputtering, and then the Ni and a polysilicon are reacted under an N$_2$ atmosphere at 370° C. for 5 min. Here, the polysilicon gate pattern 13 over the P-type region (P well) comprises an NiSi$_2$ crystal phase in the side in contact with the gate insulating film by the influence of the implanted F and above the phase, an Ni silicide comprising an NiSi crystal phase is formed. In the gate pattern 12 over the N-type region (N well) where a dopant is not implanted, Ni silicide entirely having an Ni$_3$Si crystal phase is formed. Thus, it has been confirmed that even when using F as a dopant, it is effective in preventing proceeding of a siliciding reaction as is in the use of B and preventing an NiSi$_2$ crystal phase from having an Ni-rich composition after silicidation. The observation that a lower concentration of F than B as an implanted dopant has the same effect as B would be explained by resistance of F to sweeping to a silicide interface in comparison with B (binding of F to a lattice point is stronger than B) which results in an equivalent residual concentration in the silicide with a smaller implantation amount.

A $V_{th}$ is measured for each transistor, comprising the gate electrode in which the NiSi$_2$ crystal phase and the Ni$_3$Si crystal phase are adjacent to each other, giving 0.35 V for the gate electrode for an NMOS and −0.35 V for the gate electrode for a PMOS, which correspond to $V_{th}$s obtained assuming that effective work function are 4.4 eV (an effective work function of the NiSi$_2$ crystal phase) and 4.8 eV (an effective work function of the Ni$_3$Si crystal phase), respectively. It is thus confirmed from the electric properties that mutual diffusion does not occur between the NiSi$_2$ crystal phase and the Ni$_3$Si crystal phase. This semiconductor device is measured in the same manner after annealing under N$_2$ at 500° C. for 10 min, indicating no variation in a $V_{th}$. It is thus confirmed that in a gate electrode formed in this example where the NiSi$_2$ crystal phase and the Ni$_3$Si crystal phase are adjacent to each other, a gate electrode composition is unchanged by heating at 500° C. or lower after preparation of the transistors, due to the presence of the dopant. It has been found that a temperature of this heating is slightly higher in F implantation as a dopant than that in B implantation.

It has been also found that as a variation of this embodiment, the use of C, N as a dopant element implanted to the gate pattern over the polysilicon P-type region (P well) 19 formed as a gate pattern is comparably effective to implantation of F. However, each element gives a different concentration of a dopant remaining over an interface between the gate electrode and the gate insulating film after silicidation. Thus, it is necessary for obtaining a concentration of a dopant remaining in a silicide of $3\times10^{21}$ cm$^{-3}$ or higher to optimize the amount of a dopant preliminarily implanted into the gate pattern for each element.

Embodiment 3

The third embodiment of the present invention is a variation of Embodiment 1, and is different from Embodiment 1 in that an oxide film as a hard mask (a dopant-implantation preventing mask) is not formed over a polysilicon formed as a gate pattern. This embodiment will be described with reference to FIG. 9. The steps to the formation of a gate insulating film were as described for Embodiment 1.

Then, a polysilicon layer of a thickness of 60 nm was formed on the gate insulating film 17. Then, a resist mask was formed in a part 12 in this polysilicon layer over the N-type region (N well), and As ions were implanted only into a part 13 in a polysilicon layer over the P-type region (P well) with an implantation area density of $7\times10^{15}$ cm$^{-2}$. Next, without forming a silicon oxide film, lithography and RIE (Reactive Ion Etching) were conducted to form gate patterns 14a and 14b made of polysilicon over the gate insulating film.

Next, ions were implanted using the gate patterns 14a and 14b as a mask to form extension diffusion layer regions in a self-aligned manner. An implantation area density of a dopant into a part to be the extension diffusion layer regions was $7\times10^{14}$ cm$^{-2}$ (As) for a P-type region (P well) 19 (NMOS transistor) and $7\times10^{14}$ cm$^{-2}$ (B) for an N-type region (N well) 18 (PMOS transistor). Furthermore, a silicon oxide film was deposited and then was etched back to form a gate sidewall 15 in the side wall of the polysilicon layer. In this state, ions were again implanted and were annealed for activation to form a source/drain region 5 (FIG. 9(a)). An implantation area density of a dopant into a part to be the source/drain region was $2\times10^{15}$ cm$^{-2}$ (As) for a P-type region (P well) 19 (NMOS transistor) and $3\times10^{15}$ cm$^{-2}$ (B) for an N-type region (N well) 18 (PMOS transistor).

Here, since a hard mask was absent over the polysilicon constituting the gate pattern, the dopant was also implanted into the polysilicon during forming the extension diffusion layer region and the source/drain region. Therefore, 14b in the polysilicon gate pattern over the P-type region (P well) 19 (NMOS transistor) was implanted with, in addition to As implanted before gate-pattern processing, As during forming the extension diffusion layer region and the source/drain region, and thus the total amount of the dopant implanted was $9.7\times10^{15}$ cm$^{-2}$. On the other hand, 14a in the polysilicon gate pattern over the N-type region (N well) 18 (PMOS transistor) was implanted with B during forming the extension diffusion layer region and the source/drain region in the total area density of $3.7\times10^{15}$ cm$^{-2}$.

Then, an Ni film was deposited over the whole surface by sputtering, and by salicide technique, an Ni silicide layer 22 was formed only over the source/drain region using the semiconductor region, the gate sidewall 15 and the STI 16 as a mask (FIG. 9(b)). This silicide layer 22 was made of Ni monosilicide (NiSi) which can have a minimized contact resistance. As the silicide layer, the Ni silicide may be substituted by Co silicide or Ti silicide.

Furthermore, by CVD (Chemical Vapor Deposition), an interlayer insulating film 21 consisting of a silicon oxide film was formed. This interlayer insulating film 21 and the Ni silicide over the gate pattern were removed and planarized by CMP, to expose the upper surfaces of the polysilicon gate patterns 14a and 14b (FIG. 9(c)). Then, an Ni layer 24 of a thickness of 120 nm was deposited to over the whole surface by sputtering (FIG. 9(d)).

Next, the Ni was reacted with the polysilicon under an $N_2$ atmosphere at 370° C. for 5 min. Here, in the polysilicon gate pattern 14b over the P-type region (P well) 19 (NMOS transistor), Ni silicide comprising an $NiSi_2$ crystal phase was formed due to influence by the implanted As. This is because the implanted As prevents proceeding of the siliciding reaction and a certain concentration or more of As remaining within the gate electrode after silicidation prevents a composition of the $NiSi_2$ crystal phase from being Ni-rich. Here, an As concentration in the silicide was, as the minimum, $4.0 \times 10^{20}$ cm$^{-3}$.

On the other hand, in the polysilicon gate pattern 14a over the N-type region (N well) 18 (PMOS region) to which B was implanted, an Ni silicide entirely comprising an $Ni_3Si$ crystal phase was formed (FIG. 9(e)). This is because an area density of the implanted B was so small ($5.7 \times 10^{19}$ cm$^{-3}$ as the maximum concentration) that B did not remain at a concentration of $1 \times 10^{20}$ cm$^{-3}$ or more in the silicide gate electrode after silicidation and thus was substantially ineffective in retarding the siliciding reaction. Here, diffusion of Ni to be a diffusing species in the direction of 8 was prevented to form an interface 7 between the silicide regions (A) and (B) over isolation region.

A $V_{th}$ was measured for each transistor, comprising the gate electrode thus formed in which the $NiSi_2$ crystal phase and the $Ni_3Si$ crystal phase were adjacent to each other, giving 0.35 V for the NMOS region and −0.35 V for the PMOS region, which corresponded to $V_{th}$s obtained assuming that effective work function were 4.4 eV (an effective work function of the $NiSi_2$ crystal phase) and 4.8 eV (an effective work function of the $Ni_3Si$ crystal phase), respectively. It was thus confirmed from the electric properties that mutual diffusion did not occur between the $NiSi_2$ crystal phase and the $Ni_3Si$ crystal phase. This transistor was measured in the same manner after annealing under $N_2$ at 450° C. for 10 min, indicating no variation in a $V_{th}$. It was thus confirmed that the gate electrode formed in this example where the $NiSi_2$ crystal phase and the $Ni_3Si$ crystal phase were adjacent to each other, was resistant to heating at 450° C. or lower after forming the transistor.

As described above, even when a dopant is implanted into a gate pattern expected to have a larger atomic composition ratio, the dopant is not so effective in preventing a siliciding reaction and in a silicide after silicidation, a concentration of a remaining dopant can be adjusted to less than $3 \times 10^{20}$ cm$^{-3}$ if the implantation amount is small, so that a gate electrode having a larger metal atomic composition ratio can be formed.

The invention claimed is:

1. A semiconductor device, comprising:
an N-type region and a P-type region formed within a semiconductor substrate such that the N-type region and the P-type region are isolated by an isolation region;
a line electrode formed over the N-type region, the isolation region, and the P-type region;
a PMOS transistor comprising a first gate electrode constituted by the line electrode over the N-type region and a gate insulating film formed between the first gate electrode and the semiconductor substrate; and
an NMOS transistor comprising a second gate electrode constituted by the line electrode over the P-type region and a gate insulating film formed between the second gate electrode and the semiconductor substrate,
wherein the gate insulating film comprises at least a Hf-containing high-dielectric insulating film which contacts with the first gate electrode and the second gate electrode,
the line electrode comprises a silicide region (A) comprising the first gate electrode and a silicide region (B) comprising the second gate electrode,
one silicide region of the silicide region (A) and one silicide region of the silicide region (B) comprise a silicide (a) as a silicide of a metal M to be a diffusing species in a siliciding reaction,
the other silicide region of the silicide region (A) and the other silicide region of the silicide region (B) comprise a silicide layer (C) in contact with the gate insulating film, and
the silicide layer (C) comprises a silicide (b) as a silicide of a metal M having a smaller atomic composition ratio of metal M than the silicide (a) and a dopant substantially preventing diffusion of the metal M in the silicide (b).

2. The semiconductor device as claimed in claim 1,
wherein the metal M is Ni,
the silicide region (A) is the one silicide region comprising an Ni silicide having an Ni atomic composition ratio of 60% or more as the silicide (a), and
the silicide region (B) is the other silicide region comprising an Ni silicide having an Ni atomic composition ratio of less than 60% as the silicide (b) in the silicide layer (C).

3. The semiconductor device as claimed in claim 2,
wherein an Ni silicide as the silicide (a) is an $Ni_3Si$ crystal phase or $Ni_2Si$ crystal phase.

4. The semiconductor device as claimed in claim 2,
wherein an Ni silicide as the silicide (b) is an NiSi crystal phase or $NiSi_2$ crystal phase.

5. The semiconductor device as claimed in claim 2,
wherein the silicide layer (C) comprises, as the dopant, at least one element (D) selected from the group consisting of B, As, C, F and N, and
the total concentration of the element (D) in the silicide layer (C) is $1 \times 10^{20}$ cm$^{-3}$ or more.

6. The semiconductor device as claimed in claim 2,
wherein the silicide layer (C) comprises, as the dopant, at least one element (D) selected from the group consisting of B, As, C, F and N, and
the total concentration of the element (D) in the silicide layer (C) is $3 \times 10^{20}$ cm$^{-3}$ or more.

7. The semiconductor device as claimed in claim 1,
wherein the gate insulating film is multilayered, and
further comprising at least one of a silicon oxide layer and a silicon oxynitride layer below the Hf-containing high-dielectric insulating film.

8. The semiconductor device as claimed in claim 1,
wherein the Hf-containing high-dielectric insulating film is a HfSiON layer.

9. The semiconductor device as claimed in claim 1,
wherein the NMOS transistor and the PMOS transistor constitute a CMOS transistor.

* * * * *